United States Patent
Sato

(10) Patent No.: US 7,068,476 B2
(45) Date of Patent: Jun. 27, 2006

(54) MAGNETIC SENSING ELEMENT HAVING NO VARIATION IN TRACK WIDTH AND CAPABLE OF PROPERLY COMPLYING WITH TRACK NARROWING

(75) Inventor: Kiyoshi Sato, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/124,743

(22) Filed: Apr. 17, 2002

(65) Prior Publication Data

US 2002/0191353 A1    Dec. 19, 2002

(30) Foreign Application Priority Data

Apr. 20, 2001   (JP) ............... 2001-122914

(51) Int. Cl.
    *G11B 5/39* (2006.01)
(52) U.S. Cl. .................................... 360/322
(58) Field of Classification Search ............... 360/322, 360/324.12, 324.11, 324.1
    See application file for complete search history.

(56) References Cited

U.S. PATENT DOCUMENTS

| | | | |
|---|---|---|---|
| 5,438,470 A * | 8/1995 | Ravipati et al. ............ 360/322 |
| 5,739,990 A | 4/1998 | Ravipati et al. | |
| 5,893,981 A * | 4/1999 | Dovek et al. ................ 216/22 |
| 5,905,611 A * | 5/1999 | Yoda et al. .............. 360/324.1 |
| 5,936,810 A | 8/1999 | Nakamoto et al. | |
| 6,007,731 A * | 12/1999 | Han et al. ...................... 216/22 |
| 6,040,962 A | 3/2000 | Kanazawa et al. | |
| 6,108,176 A * | 8/2000 | Yokoyama .............. 360/324.11 |
| 6,385,016 B1 * | 5/2002 | van Ek et al. .............. 360/322 |
| 6,433,971 B1 * | 8/2002 | Sato et al. .................. 360/322 |
| 6,444,406 B1 * | 9/2002 | Ito et al. ..................... 430/320 |
| 6,562,486 B1 * | 5/2003 | Sakakima et al. .......... 428/692 |
| 6,606,216 B1 * | 8/2003 | Liikanen et al. ......... 360/77.08 |
| 6,665,153 B1 * | 12/2003 | Hayashi ..................... 360/322 |
| 6,716,537 B1 * | 4/2004 | Kakihara .................... 428/611 |
| 6,785,954 B1 * | 9/2004 | Horng et al. ............. 29/603.14 |
| 6,813,121 B1 * | 11/2004 | Pinarbasi .................... 360/322 |

* cited by examiner

*Primary Examiner*—Angel Castro
(74) *Attorney, Agent, or Firm*—Brinks Hofer Gilson & Lione

(57) ABSTRACT

The inner side end faces of electrode layers are formed in a region under which bias layers are not formed, to be located behind a magnetoresistive film in the height direction. Therefore, a sensing current flowing from the electrode layers can be appropriately inhibited from shunting to the bias layers, thereby permitting the manufacture of a magnetic sensing element capable of complying with track narrowing and suppressing variations in the track width Tw.

11 Claims, 20 Drawing Sheets

FIG. 20
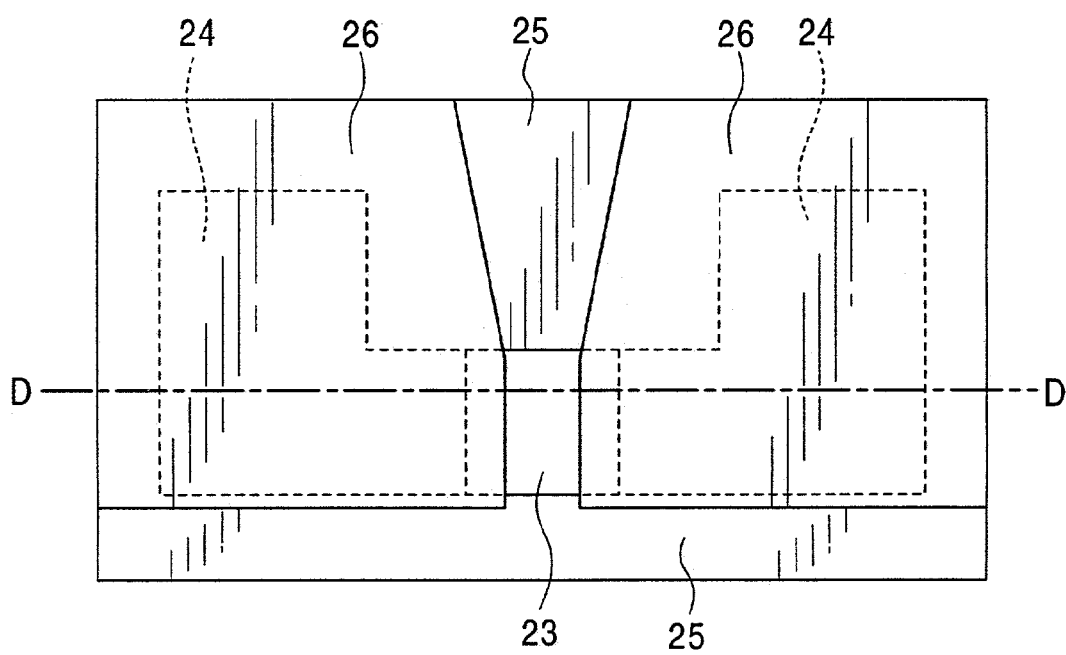
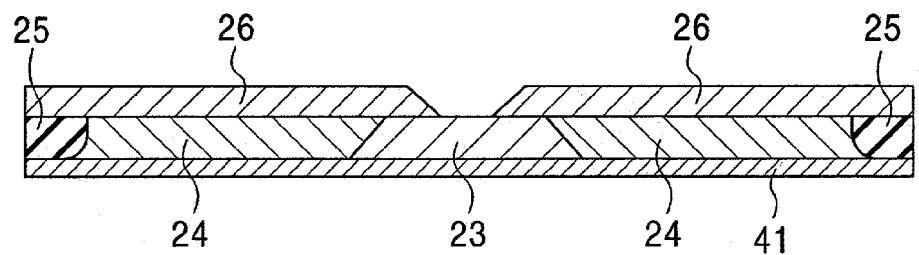

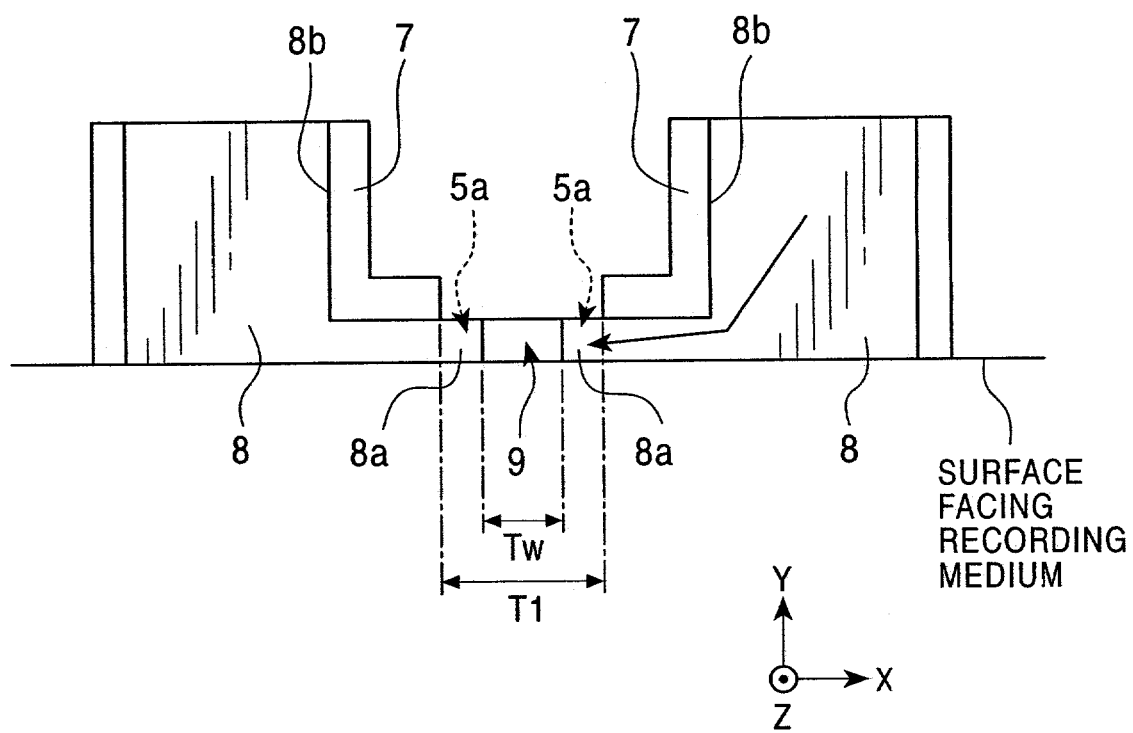

FIG. 27
PRIOR ART
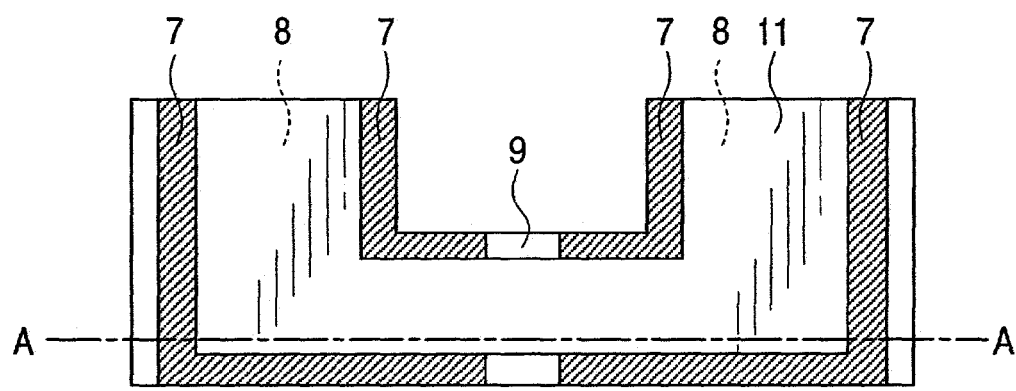
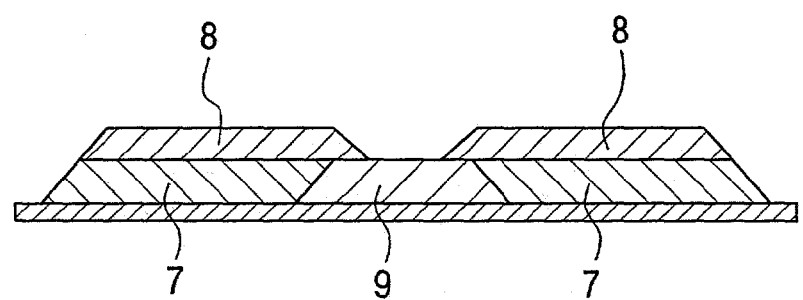

MAGNETIC SENSING ELEMENT HAVING NO VARIATION IN TRACK WIDTH AND CAPABLE OF PROPERLY COMPLYING WITH TRACK NARROWING

BACKGROUND OF THE INVENTION

1. Field of the Invention

The present invention relates to a magnetic sensing element mounted on, for example, a hard disk device or the like, and particularly to a magnetic sensing element having no variation in the track width and capable of appropriately complying with track narrowing.

2. Description of the Related Art

FIG. 21 is a partial sectional view of a conventional sensing element (spin-valve thin film element), as viewed from a surface facing a recording medium.

Reference numeral 1 denotes an underlying layer made of Ta or the like. An antiferromagnetic layer 2 made of a PtMn alloy or the like, a pinned magnetic layer 3 made of a NiFe alloy or the like, a nonmagnetic intermediate layer 4 made of Cu or the like, a free magnetic layer 5 made of a NiFe alloy or the like, a protecting layer 6 made of Ta or the like are formed on the underlying layer 1. The layers ranging from the underlying layer 1 to the protecting layer 6 constitute a magnetoresistive film 9.

In the conventional example shown in FIG. 21, hard bias layers 7 made of a hard magnetic material are formed on both sides of the magnetoresistive film 9 in the track width direction (the X direction shown in the drawing), and electrode layers 8 are respectively formed on the hard bias layers 7.

However, the spin-valve thin film element shown in FIG. 21 has the following problem.

Although the width dimension of the upper surface of the free magnetic layer 5 in the track width direction is defined as track width Tw, the track width Tw will be decreased with increases in the recording density in future. In this case, both side ends 5a of the free magnetic layer 5 are magnetized by strong longitudinal bias magnetic fields from the hard bias layers 7 to cause difficulties in reversal of magnetization at both side ends 5a with an external magnetic field. This causes so-called dead zones. Therefore, a zone (a so-called sensitive zone) which can produce substantial reversal of magnetization, and exhibit magnetoresistance becomes narrower than the track width Tw, thereby causing the problem of further narrowing the sensitive zone to decrease reproduced output with track narrowing.

Therefore, a conventional spin valve thin film element has a structure improved for securing a sensitive zone of a predetermined size even if both side ends 5a of the free magnetic layer 5 become the dead zones, as described below.

FIG. 22 is a partial sectional view of an improved conventional spin valve thin film element, as viewed from the surface side facing a recording medium. In the drawing, the layers denoted by the same reference numerals as FIG. 21 denote the same layers as FIG. 21.

In the conventional example shown in FIG. 22, the width dimension of the upper surface of the free magnetic layer 5 in the track width direction is T1 longer than the track width Tw shown in FIG. 21.

The electrode layers 8 are formed to extend from the hard bias layers 7 to the protecting layer 6 formed on the free magnetic layer 5. The portions of the free magnetic layer 5, which are overlapped with the electrode layers 8, are the dead zones.

In this conventional example, the track width Tw is defined by the space between the electrode layers 8, and the area in the track width Tw corresponds to the sensitive zone of the free magnetic layer 5. Therefore, the whole area in the track width Tw is substantially concerned with magnetoresistance.

In the conventional example, the width dimension T1 of the free magnetic layer 5 in the track width direction can be appropriately regulated to secure the sensitive zone of a predetermined size even in narrowing of the track in future, and thus a predetermined level of reproduced output can be expected.

FIG. 23 shows the structure of the magnetic sensing element shown in FIG. 22, as viewed from above.

As shown in a partial plan view of FIG. 23, the electrode layers 8 are formed to overlap the upper surfaces of the hard bias layers 7 formed on both sides of the magnetoresistive film 9 in the track width direction so that the inner side ends 8a of the electrode layers 8 are overlapped with both side ends 5a of the free magnetic layer 5.

FIGS. 24 to 27 respectively show the steps of manufacturing the magnetic sensing element shown in FIGS. 22 and 23. FIGS. 24A to 27A are partial plan views, and FIGS. 24B to 27B are partial sectional views taken along one-dot chain lines in FIGS. 24A to 27A, respectively, as viewed from the direction of arrows.

In the step shown in FIG. 24, after the magnetoresistive film 9 is deposited on a substrate 10, a resist layer 12 is formed on the magnetoresistive film 9, and a pattern 12a for forming biases and electrodes in the resist layer 12 is formed by an exposure phenomenon. Then, the portions of the magnetoresistive film 9, which are exposed from the pattern 12a, are moved by ion milling or the like, and the hard bias layers 7 are then deposited by sputtering substantially perpendicularly to the substrate 10.

Next, in the step shown in FIG. 25, the electrode layers 8 are formed to overlap the hard bias layers 7 by using the resist layer 12. In this step, the sputtering angle is set so that the sputtering direction is more inclined than that in the formation of the hard bias layers 7, thereby permitting the formation of the electrode layers 8 in notch portions formed at the lower surface of the resist layer 12. Consequently, the inner side ends 8a of the electrode layers 8 can be formed to overlap both side ends 5a of the free magnetic layer 5. Then, the resist layer 12 is removed.

In the step shown in FIG. 26, a resist layer 11 for determining the rear end in the height direction is formed on the electrode layers 8 and the magnetoresistive film 9 held between the inner side ends 8a of the electrode layers 8. Then, the portions of the electrode layers 8 and the magnetoresistive film 9, which are not covered with the resist layer 11, are removed by, for example, ion milling in the directions of arrows F. This state is shown in FIG. 27. In FIG. 27, for the sake of ease of seeing, the portions of the hard bias layers 7, which are exposed by removing the electrode layers 8, are shaded.

As shown in FIG. 27, the resist layer 11 functions as a mask for ion milling to leave the electrode layers 8 having the same size as the resist layer 11 below the resist layer 11, and leave the hard bias layers 7 having an area larger than the lower surfaces of the electrode layers 8 below the electrode layers.

Then, the resist layer 11 is removed, and the magnetic sensing element shown in FIG. 27 is cut up to line A—A for determining the height to complete the magnetic sensing element shown in a lower drawing (partial sectional view) of FIG. 27 and FIGS. 22 and 23.

As shown in the steps shown in FIGS. 24 and 25, conventionally, the hard bias layers 7 and the electrode layers 8 are continuously formed by sputtering deposition using the same resist layer 12. However, the magnetic sensing element manufactured by the above-described manufacturing method causes the following problems.

Since a sensing current from the electrode layers 8 is liable to flow through the shortest distance, the flow of the sensing current is concentrated in the vicinity of the inner side end face 8b of each of the electrode layers 8 as shown by an arrow in FIG. 23.

However, as shown in FIG. 23, the hard bias layers 7 are present below the inner side end faces 8b of the electrode layers 8, and thus the sensing current shunts to the hard bias layer 7 provided below each of the electrode layers 8 as shown by arrow B in FIG. 22 before the sensing current passes through the vicinity of the inner side end face 8b of each of the electrode layers 8 and reaches the inner side end 8a. This causes the problem of deteriorating the current density at the inner side end 8a of each of the electrode layers 8.

Therefore, reproduced output deteriorates, and the sensing current shunting to the hard bias layers 7 also flows into the dead zones of the magnetoresistive film 9. In the dead zones, magnetization is not securely pinned, and particularly, magnetization in the areas near the dead zones is actually reversed with an external magnetic field in spite of lower sensitivity than the active zone. Therefore, the dead zones also partially function as reproducing regions to widen the track width, thereby failing to comply with track narrowing. There is also the problem of causing variations in the track width.

SUMMARY OF THE INVENTION

Accordingly, the present invention has been achieved for solving the above problems, and an object of the present invention is to provide a magnetic sensing element capable of preventing a sensing current flowing from an electrode layer to a magnetoresistive film from shunting to a bias layer, suppressing variations in the track width and complying with track narrowing, and a method of manufacturing the magnetic sensing element.

In order to achieve the object, the present invention provides a magnetic sensing element comprising a magnetoresistive film having a portion exhibiting magnetoresistance, and bias layers and electrode layers provided on both sides of the magnetoresistive film in the track width direction, wherein the electrode layers are formed with a predetermined space therebetween to extend from the rear in the height direction to the magnetoresistive film, and the bias layers are not formed below the inner side end faces of the electrode layers which are formed behind the magnetoresistive film in the height direction.

In the present invention, the electrode layers are formed to overlap the magnetoresistive film. The track width Tw is controlled by the space between the electrode layers in the track width direction, which are formed to overlap the magnetoresistive film.

In the present invention, the magnetoresistive film can thus be formed with a longer width dimension than the track width Tw. Therefore, even when track narrowing is demanded, the width dimension of the magnetoresistive film can be appropriately controlled to maintain a sensitive zone having a predetermined width.

In the present invention, the inner side end faces of the electrode layers are formed behind the magnetoresistive film in the height direction, and the bias layers are not formed below the inner side end faces.

As described above, a flow of a sensing current from the electrode layers flows through the shortest distance, i.e., the flow is concentrated in the vicinities of the inner side end faces of the electrode layers. Since the bias layers are not formed below the inner side end faces, therefore, the sensing current flowing from the electrode layers can be appropriately inhibited from shunting to the bias layers. Thereby, the current density at the inner side end of each of the electrode layers overlapping the magnetoresistive film can be improved.

Therefore, in the present invention, reproduced output can be improved, and shunting of the sensing current from the bias layers to the dead zones can be suppressed to cause the sensing current to appropriately flow from the inner side ends of the electrode layers to the sensitive zone of the magnetoresistive film. It is thus possible to manufacture a magnetic sensing element capable of preventing the problem of widening the track width, complying with track narrowing and suppressing a variation in the track width Tw, as compared with a conventional magnetic sensing element.

In the present invention, except the surface facing a recording medium, the peripheries of the magnetoresistive film and the bias layers are preferably filled with an insulating layer so that the inner side end faces of the electrode layers are formed on the insulating layer. By filling the peripheries of the magnetoresistive film and the bias layers with the insulating layer, the electrode layers can be formed, with high pattern accuracy, on a region having less step.

The upper surface of the magnetoresistive film is more preferably coplanar with the upper surfaces of the bias layers and the insulating layer.

In the present invention, the electrode layers may be formed to overlap the portions of the bias layers which are formed on both sides of the magnetoresistive film in the track width direction.

Even when the electrode layers are formed to overlap the bias layers, the sensing current flowing from the electrode layers mainly flows in the vicinities of the inner side end faces of the electrode layers, where the bias layers are not formed, and thus shunting of the sensing current to the bias layers can be appropriately suppressed.

When the electrode layers are formed in a large size so as to overlap the bias layers, an upper gap layer formed on the electrode layers can be formed on a region having a gentle step, and thus the upper gap layer and an upper shield layer to be formed on the upper gap layer can easily be formed in a predetermined shape, thereby permitting the manufacture of a magnetic sensing element having excellent reproducing characteristics.

By forming the electrode layers of a large size, the electrode layers can easily be formed in a predetermined shape without the need for a high degree of alignment accuracy.

In an embodiment of the present invention, the magnetoresistive film comprises an antiferromagnetic layer, a pinned magnetic layer, a nonmagnetic intermediate layer, and a free magnetic layer. However, the magnetoresistive film is not limited to this laminated structure.

A method of manufacturing a magnetic sensing element of the present invention comprises the following steps:

(a) The step of depositing a magnetoresistive film on a substrate, forming opposite bias formation regions on both sides of the magnetoresistive film in the track width direction, and then depositing the bias layers in the bias layer formation regions.

(b) The step of forming a resist layer on the magnetoresistive film and the bias layers, for determining the rear end in the height direction, removing the portions of the magnetoresistive film and the bias layers, which are not covered with the resist layer, depositing an insulating layer on the substrate exposed by removing the uncovered portions of the magnetoresistive film and the bias layers, and then removing the resist layer.

(c) The step of forming a resist layer on the magnetoresistive film, the bias layers, and the insulating layer, forming opposite electrode patterns in the resist layer on both sides in the track width direction by an exposure phenomenon in such a manner that both side ends of the magnetoresistive film are exposed in the electrode patterns, and the inner side end faces of the electrode patterns are formed on the insulating layer to be positioned behind the magnetoresistive film in the height direction.

(d) The step of depositing an electrode material in the electrode patterns, and removing the resist layer to form the electrode layers with a space therebetween in the track width direction to extend from the rear in the height direction to the magnetoresistive film so that the inner side end faces are formed on the insulating layer to be positioned behind the magnetoresistive film in the height direction.

The manufacturing method of the present invention is different from a conventional method (refer to FIGS. 24 to 27) in that after the bias layers are deposited, the periphery thereof is filled with the insulating layer, and then the electrode layers are formed by using the new resist layer having the electrode patterns formed therein, while in the conventional method, the bias layers and the electrode layers are continuously deposited by using the same resist layer.

Namely, in the present invention, the step of depositing the bias layers and the step of depositing the electrode layers are separately provided. Therefore, in the steps (c) and (d) of the manufacturing method of the present invention, the electrode layers can be formed on the insulating layer extending from the magnetoresistive film to the rear in the height direction.

In the present invention, in the step (c), the electrode patterns may be formed on the bias layers, and in the step (d), the electrode layers may be formed on the bias layers.

In the present invention, after the step (d), a height determining process is preferably performed by cutting the insulating layer, the magnetoresistive film and the bias layers from the surface facing a recording medium.

BRIEF DESCRIPTION OF THE DRAWINGS

FIG. 20 is a drawing showing a step after the step shown in FIG. 19;

FIG. 23 is a partial plan view showing the magnetic sensing element shown in FIG. 22, as viewed from above;

FIG. 27 is a drawing showing a step after the step shown in FIG. 26.

DESCRIPTION OF THE PREFERRED EMBODIMENTS

Figure 1:
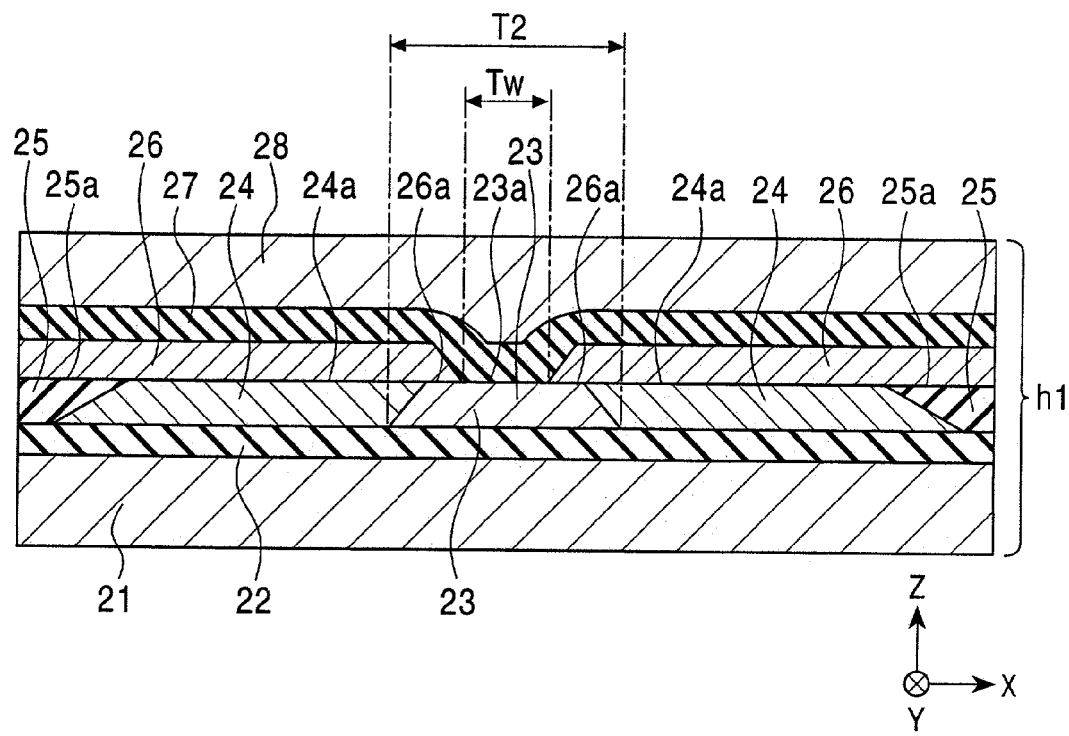
FIG. 1 is a partial sectional view showing a thin film magnetic head comprising a magnetic sensing element according to a first embodiment of the present invention, as viewed from a surface facing a recording medium.
Figure 2:
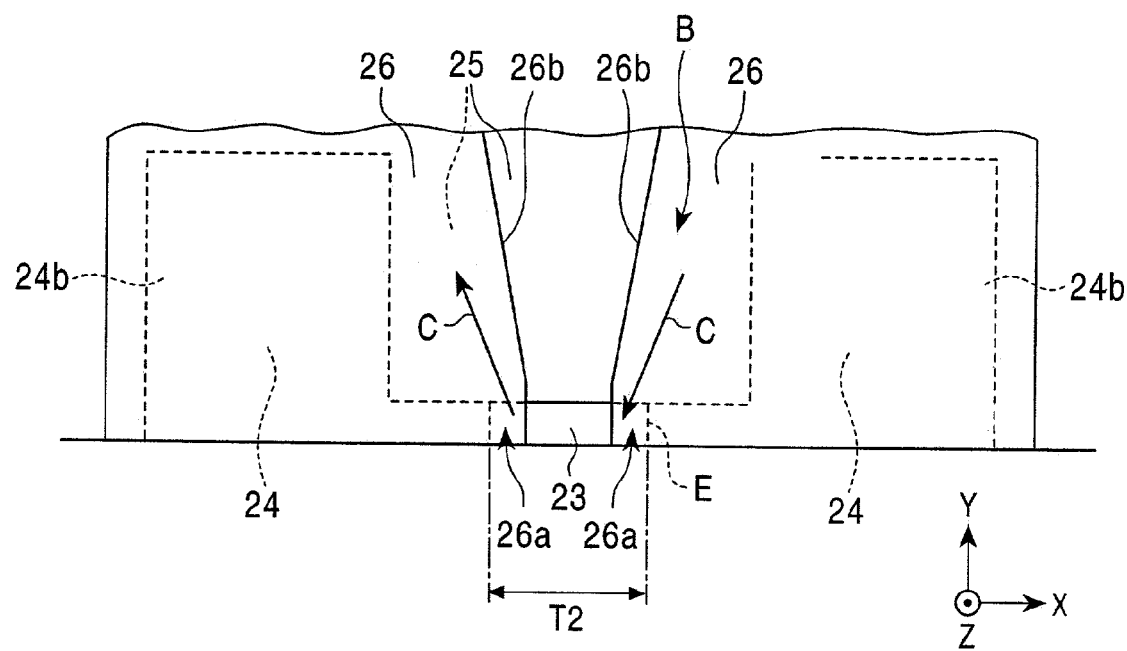
FIG. 2 is a partial plan view of the magnetic sensing element shown in FIG. 1, as viewed from above.

FIG. 1 is a partial sectional view showing the structure of a thin film magnetic head comprising a magnetic sensing element (spin valve thin film element) according to a first embodiment of the present invention, as viewed from a surface facing a recording medium. FIG. 2 is a partial plan view of the magnetic sensing element, as viewed from above.

The thin film magnetic head shown in FIG. 1 is an MR head h1 for reproducing external signals recorded on the recording medium. Although FIG. 1 shows only the MR head h1, an inductive head for recording may be laminated on the MR head h1. The inductive head comprises a core layer and coil layer made of a magnetic material.

When the inductive head is formed on the MR head h1, an upper shield layer of the MR head h1 is also used as a lower core layer of the inductive head.

The MR head h1 is formed on the trailing-side end face of a slider made of, for example, alumina titanium carbide ($Al_2O_3$ TiC). The side of the slider opposite to the surface facing the recording medium is bonded to an elastically deformable supporting member made of a stainless material or the like to form a magnetic head device.

In FIG. 1, reference numeral 21 denotes a lower shield layer. The lower shield layer 21 is made of a magnetic material such as a NiFe alloy, sendust, or the like.

Furthermore, a lower gap layer 22 made of an insulating material such as $Al_2O_3$, $SiO_2$, or the like is formed on the lower shield layer 21.

As shown in FIG. 1, a magnetoresistive film 23 is formed at the center of the upper surface of the lower gap layer 22. The magnetoresistive film 23 shown in FIG. 1 is referred to as a "single spin-valve thin film element", for example. The magnetoresistive film 23 comprises, for example, the four layers including an antiferromagnetic layer, a pinned magnetic layer, a nonmagnetic intermediate layer, and a free magnetic layer. The structure of the magnetoresistive film 23 is not limited to the single spin-valve thin film element, and applicable structures of the magnetoresistive film 23 will be described in detail later.

A structure comprising the three layers including a free magnetic layer, a nonmagnetic intermediate layer and a pinned magnetic layer can be applied to the magnetoresistive film 23 as long as it has a portion exhibiting magnetoresistance, and it is a spin-valve thin film element. In the free magnetic layer, magnetization freely changes with an external magnetic field. The free magnetic layer is magnetized in the track width direction (the X direction shown in the drawings). On the other hand, magnetization of the pinned magnetic layer is pinned in the height direction (the Y direction) due to an exchange coupling magnetic field produced between the pinned magnetic layer and the antiferromagnetic layer. The electric resistance changes based on the relationship between the change in magnetization of the free magnetic layer and the pinned magnetization direction of the pinned magnetic layer so that a signal of the external magnetic field can be detected. This is referred to as "magnetoresistance". When the magnetoresistive film 23 comprises an AMR thin film element, a layer exhibiting magnetoresistance is a magnetoresistive layer (MR layer).

Furthermore, hard bias layers 24 are formed on both sides of the magnetoresistive film 23 in the track width direction (the X direction). The hard bias layers 24 are made of, for example, CoPt (cobalt-platinum) alloy, a CoCrPt (cobalt-chromium-platinum) alloy, or the like. Also, a laminated structure of Cr/CoPt/Ta or Cr/CoCrPt/Ta may be used. The hard bias layers 24 are provided for putting magnetization of the free magnetic layer, which constitutes the magnetoresistive film 23, in a single magnetic domain state in the track width direction (the X direction).]

In the present invention, insulating layers (backfill gap) 25 are further formed on both sides of the hard bias layers 24 in the track width direction. The insulating layers 25 are made of a material generally used as an insulating material, such as $Al_2O_3$, $SiO_2$, or the like.

In this embodiment, the upper surface 23a of the magnetoresistive film 23 is coplanar with the upper surfaces 24a of the hard bias layers 24 and the upper surfaces 25a of the insulating layers 25. This is preferred from the viewpoint that electrode layers 26 can easily appropriately be formed in a predetermined shape on these upper surfaces. However, these surfaces are not necessarily completely coplanar, and the surfaces may have a step to some extent. Particularly, this embodiment is characterized in that by forming the insulating layers 25, the insulating layers 25, the hard bias layers 24 and the magnetoresistive film 23 are formed on substantially the same plane.

Then, the electrode layers 26 are formed with a predetermined space therebetween in the track width direction (the X direction) on the magnetoresistive film 23. In this embodiment, the electrode layers 26 are formed on the hard bias layers 24 and the insulating layers 25, which are formed on both sides of the magnetoresistive film 23, so as to extend away from the magnetoresistive film 23 in the track width direction. However, the external end faces of the electrode layers 26 in the track width direction may be positioned at the same positions as the external end faces of the hard bias layers 24 in the track width direction, or closer to the magnetoresistive film 23 than the outer end faces of the hard bias layers 24.

The electrode layers 26 may comprise a single layer structure of Cr, Ta, or Al, or a laminated structure of Ti/Au/Ti, Ta/Au/Ta, TiW/Au/TiW, TaN/Au/TaN, Al/Cu/Al, Cr/Cu/Cr, Cr/Cu/Al/Cu/Cr, or Cr/Cu/Cr/Cu/Cr.

As shown in FIG. 1, an upper gap layer 27 made of an insulating material such as $Al_2O_3$, $SiO_2$ or the like is formed on the electrode layers 26 and the magnetoresistive film 23. Furthermore, an upper shield layer 28 made of a magnetic material such as a NiFe alloy or the like is formed on the upper gap layer 27.

In the thin film magnetic head of the present invention shown in FIG. 1, the inner side ends 26a of the electrode layers 26 are formed to overlap the upper surface of the magnetoresistive film 23. The track width Tw is regulated by the space between the electrode layers 26 in the track width direction.

Therefore, the width dimension T2 of the magnetoresistive film 23 in the track width direction can be made longer than the track width Tw. Even when track narrowing is demanded, the width dimension of the magnetoresistive film 23 can be appropriately controlled to secure the sensitive zone having a predetermined width, and the width of the sensitive zone can be coincided with the track width Tw.

The sensitive zone represents the zone substantially contributing to magnetoresistance. The width of the sensitive zone is measured by, for example, a microtrack profile method.

In the microtrack profile method, in scanning on a signal recorded on a microtrack in the track width direction, a zone in which reproduced output of 50% or more of the maximum output is obtained is defined as the sensitive zone. The dead zones are positioned on both sides of the sensitive zone, and defined as zones in which output of 50% or less of the maximum output is obtained.

The portions of the magnetoresistive film 23, which are defined as the dead zones, are covered with the electrode layers 26 so that the width of the sensitive zone can be coincided with the track width Tw.

The width dimension T2 of the magnetoresistive film 23 is preferably about 0.3 µm to 1.0 µm, and the track width Tw is preferably about 0.1 µm to 0.25 µm.

Particularly, the present invention is characterized by the shape of the rear of the electrode layers 26 in the height direction.

As shown in FIG. 2, the hard bias layers 24 are formed on both sides of the magnetoresistive film 23 in the track width direction, as shown by dotted lines, and the rear regions 24b of the hard bias layers 24 are formed to extend rearward in the height direction (the Y direction shown in the drawing).

As shown in FIG. 2, the regions B between the hard bias layers 24 and the magnetoresistive film 23 are filled with the insulating layers (backfill gap) 25.

In the present invention, the electrode layers 26 are formed so that the inner side ends 26a thereof overlap the magnetoresistive film 23. The electrode layers 26 are also formed to completely cover the hard bias layers 24 and extend to the portions of the insulating layers 25 formed in the regions B.

As shown in FIG. 2, the inner side end faces 26b of the electrode layers 26, which are behind the magnetoresistive film 23 in the height direction, are formed on the regions B in which the insulating layers 25 are formed below the electrode layers 26. Unlike in a conventional element (refer to FIG. 23), the inner side end faces 26b are not formed on the hard bias layers 24.

As shown in FIG. 2, the inner side end faces 26b of the electrode layers 26 are formed nearer to the center of the magnetoresistive film 23 than the joints E between the magnetoresistive film 23 and the hard bias layers 24 so as to extend rearward in the height direction. The inner side end faces 26b are not in contact with the hard bias layers 24 extending from the joints E away from the magnetoresistive film 23 in the track width direction.

A sensing current flowing between the electrode layers 26 is liable to flow through the shortest distance, and thus a flow of the sensing current is concentrated in the vicinities of the inner side end faces 26b of the electrode layers 26.

Therefore, in this embodiment of the present invention, the hard bias layers 24 are not formed below the inner side surfaces 26b of the electrode layers 26, and the inner side end faces 26 b are formed on the insulating layers 25. In this embodiment, the sensing current concentrated in the vicinities of the inner side end faces 26b of the electrode layers 26 flows through portions away from the regions in which the hard bias layers 24 are formed, as shown by arrows C in FIG. 2. Therefore, shunting of the sensing current to the hard bias layers 24 can be suppressed to increase the current density at the inner side ends 26a of the electrode layers 26, which are formed to overlap both end faces of the magnetoresistive film 23, as compared with the conventional element.

It is thus possible to increase reproduced output, and suppress shunting of the sensing current to the hard bias layers to prevent the sensing current from flowing to the dead zones, thereby concentrating the flow of the sensing current only in the sensitive zone. Therefore, it is possible to manufacture a magnetic sensing element capable of appropriately complying with track narrowing without widening the track width, and suppressing variations in the track width Tw.

In the embodiment shown in FIG. 1, as shown in FIG. 2, the peripheries of the magnetoresistive film 23 and the hard bias layers 24, except the surface facing the recording medium, are filled with the insulating layers 25, thereby permitting the easy formation of the electrode layers 26 with high pattern accuracy on a region having less step.

In the embodiment of the present invention shown in FIG. 2, the electrode layers 26 are formed to completely cover the hard bias layers 24. However, for example, as shown in FIG. 3, the outer end faces 26c of the electrode layers 26 may be positioned inward of the outer end faces 24c of the hard bias layers 24 in the track width direction (the X direction shown in the drawing) so that the hard bias layers 24 are partially exposed from the electrode layers 26.

Figure 3:
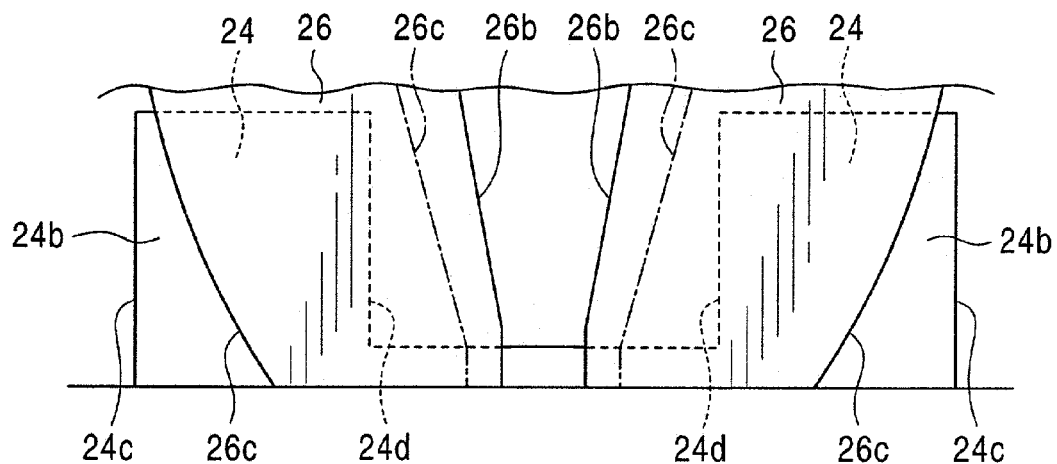
FIG. 3 is a partial plan view of another form of the magnetic sensing element, as viewed from above.

Alternatively, as shown by one-dot chain lines in FIG. 3, the outer end faces 26c of the electrode layers 26 may be positioned inward of the inner side end faces 24d of the hard bias layers 24 in the track width direction so that the hard bias layers 24 are not at all covered with the electrode layers 26, and the whole hard bias layers 24 are exposed from both ends of the electrode layers 26.

However, as shown in FIG. 2, the hard bias layers 24 are preferably completely covered with the electrode layers 26, or at least portions of the hard bias layers 24 are preferably covered with the electrode layers 26 to increase the size of the electrode layers 26. This is because the formation of the electrode layers 26 does not require a high degree of alignment accuracy, and the upper gap layer 27 can be formed on the electrode layers 26 with a gentle step to prevent the occurrence of pinholes in the upper gap layer 27, thereby appropriately securing electrical insulation.

Figure 4:
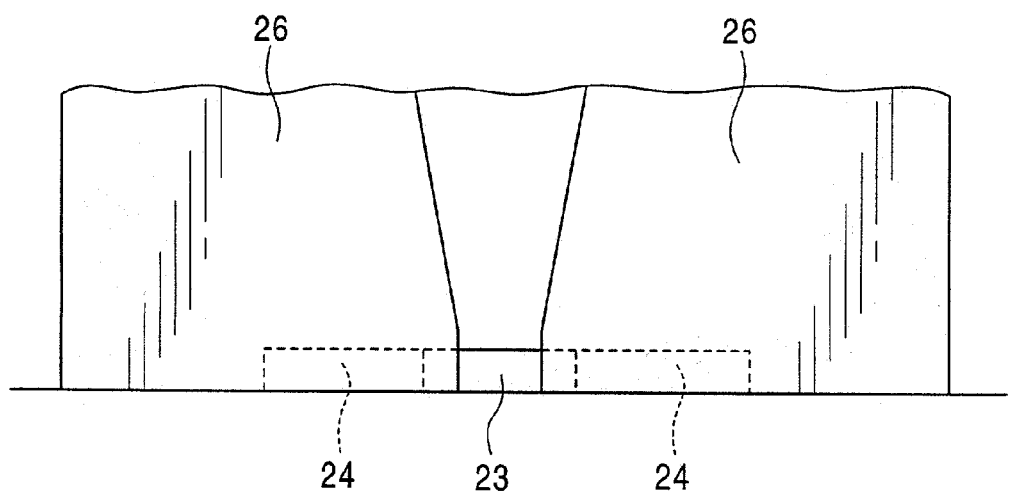
FIG. 4 is a partial plan view of a further form of the magnetic sensing element, as viewed from above.

Although, in FIGS. 2 and 3, the hard bias layers 24 are formed to have the rear regions 24b extending rearward from both side ends in the height direction, the hard bias layers 24 may be formed in a substantially rectangular shape on both sides of the magnetoresistive film 23 in the track width direction without having the rear regions 24b, as shown in FIG. 4. The hard bias layers 24 may be formed in a shape other than the shapes shown in FIGS. 2 and 4.

Figure 5:
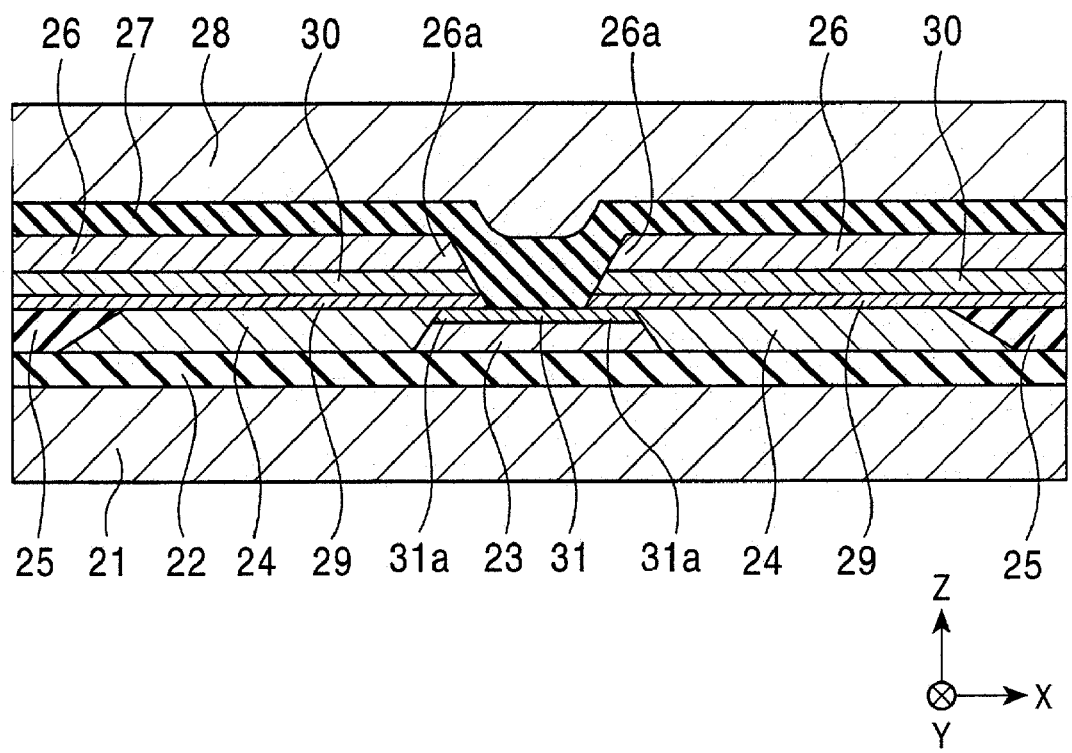
FIG. 5 is a partial sectional view showing a thin film magnetic head comprising a magnetic sensing element according to a second embodiment of the present invention, as viewed from a surface facing a recording medium.
Figure 6:
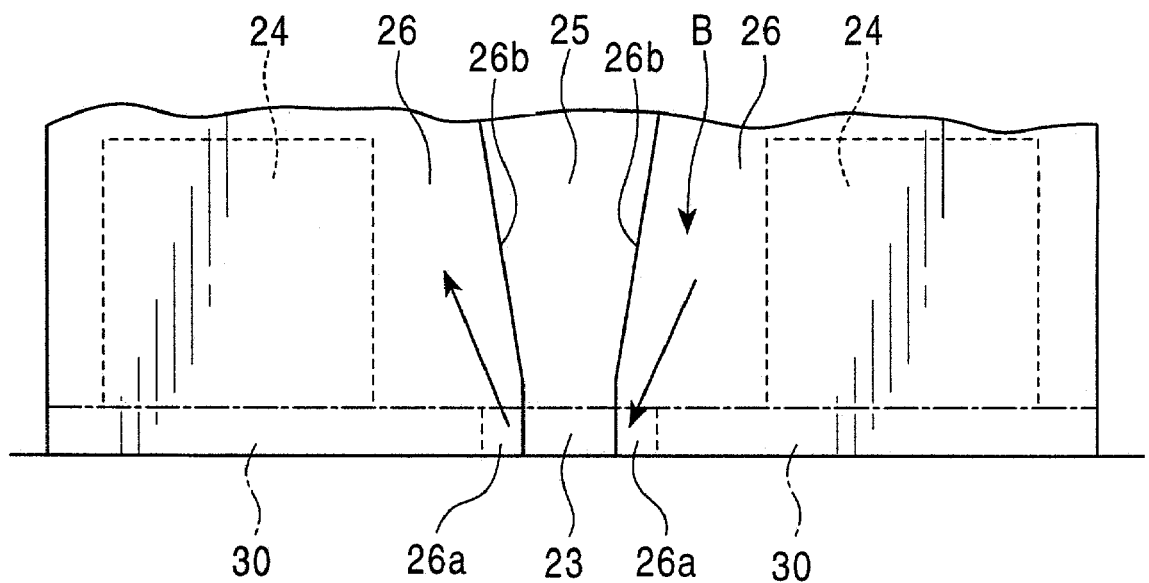
FIG. 6 is a partial plan view of the magnetic sensing element shown in FIG. 5, as viewed from above.

FIG. 5 is a partial sectional view showing the structure of a thin film magnetic head comprising a magnetic sensing element according to a second embodiment of the present invention taken along a direction parallel to a surface facing a recording medium. FIG. 6 is a partial plan view of the magnetic sensing element shown in FIG. 5.

In FIG. 5, unlike in FIG. 1, ferromagnetic layers 29 and antiferromagnetic layers 30 are provided between hard bias layers 24 and electrode layers 26. Alternatively, the ferromagnetic layers 29 and the antiferromagnetic layers 30 may be provided between the electrode layers 26 and high-resistivity layers or insulating layers made of Ta, TaN, TiN, WTi, $Al_2O_3$, $SiO_2$, or the like in place of the hard bias layers 24.

In this embodiment, a free magnetic layer 31 constituting the magnetoresistive film 23 is positioned at the uppermost layer. The ferromagnetic layers 29 are formed to overlap both side ends of the free magnetic layer 31, and the antiferromagnetic layers 30 are further formed on the ferromagnetic layers 29.

The ferromagnetic layers 29 are made of a magnetic material such as a NiFe alloy, a CoFeNi alloy, a CoFe alloy, Co, or the like. The antiferromagnetic layers 30 are made of an antiferromagnetic material containing element X (wherein X is at least one of Pt, Pd, Ir, Rh, Ru, and Os) and Mn, or an antiferromagnetic material containing element X and element X' (X' is at least one of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and the rare earth elements) and Mn.

By performing heat treatment in a magnetic field, an exchange coupling magnetic field is produced between the ferromagnetic layers 29 and the antiferromagnetic layers 30 made of the antiferromagnetic material. When the ferromagnetic layers 29 are magnetized in the X direction shown in the drawing, both side ends 31a of the free magnetic layer 31 are magnetized in the X direction due to ferromagnetic coupling with the ferromagnetic layers 29.

In this embodiment, magnetization of both side ends 31a of the free magnetic layer 31 is appropriately pinned in the X direction due to a synergistic effect between a longitudinal magnetic field from the hard bias layers 24 formed on both sides of the magnetoresistive film 23 in the track width direction, and ferromagnetic coupling with the ferromagnetic layers 29, thereby decreasing fluctuations in magnetization of both side ends 31a due to an external magnetic field. When the high-resistivity layers or insulating layers are provided in place of the hard bias layers 24, the upper surface of the magnetoresistive film 23 and the surfaces of the high-resistivity layers or insulating layers can be planarized to intensify exchange coupling force between the ferromagnetic layers 29 and the antiferromagnetic layers 30. This also permits pre-cleaning and proper ferromagnetic coupling between the free magnetic layer 31 and the ferromagnetic layers 29.

Therefore, this embodiment makes it possible to manufacture a magnetic sensing element capable of preventing variations in the track width Tw, and appropriately complying with track narrowing.

As shown in FIG. 6, in this embodiment, the inner side end faces 26b of the electrode layers 26 are formed on the regions B of the insulating layers 25 which fill the spaces between the magnetoresistive film 23 and the hard bias layers 24, and the hard bias layers 24 are not formed below the inner side end faces 26b.

Therefore, a sensing current flowing from the electrode layers 26 to the magnetoresistive film 23 mainly flows in the vicinities of the inner side end faces 26b of the electrode layers 26, i.e., in the shortest distance. In this case, the sensing current can be appropriately inhibited from shunting to the hard bias layers 24, thereby increasing the current density at the inner side ends 26a of the electrode layers 26.

It is thus possible to increase reproduced output, inhibit shunting of the sensing current to the hard bias layers 24 to prevent the sensing current from flowing in the dead zones, and properly concentrate the flow of the sensing current in the sensitive zone. This makes it possible to manufacture a magnetic sensing element capable of preventing variations in the track width Tw, and appropriately complying with track narrowing.

Figure 7:
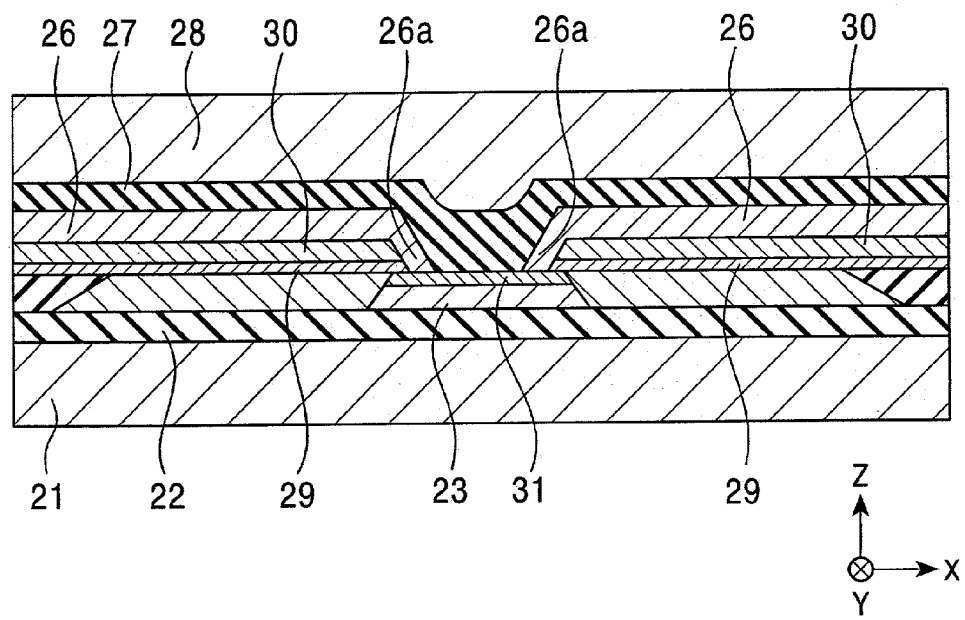
FIG. 7 is a partial sectional view showing a thin film magnetic head comprising a magnetic sensing element according to another embodiment of the present invention, as viewed from a surface facing a recording medium.

In this embodiment, as shown in FIG. 5, the inner side ends 26a of the electrode layers 26 are formed on the ferromagnetic layers 29 and the antiferromagnetic layers 30, and thus the sensing current flowing from the electrode layers 26 flows through the antiferromagnetic layers 30 and the ferromagnetic layers 29 before flowing to the magnetoresistive film 23. However, as shown in FIG. 7, the inner side ends 26a of the electrode layers 26 are preferably formed directly on the magnetoresistive film 23 so as to be positioned, in the track width direction (the X direction shown in the drawing), inward of the ferromagnetic layers 29 and the antiferromagnetic layers 30 formed to overlap the magnetoresistive film 23. In this case, the sensing current flows from the inner side ends 26a of the electrode layers 26 directly to the magnetoresistive film 23, thereby suppressing a decrease in the current value.

Next, the structure of a magnetic sensing element of the present invention will be described. FIGS. 8 to 13 are enlarged partial sectional views each showing only the magnetic sensing element, taken along a direction parallel to the surface facing the recording medium.

Figure 8:
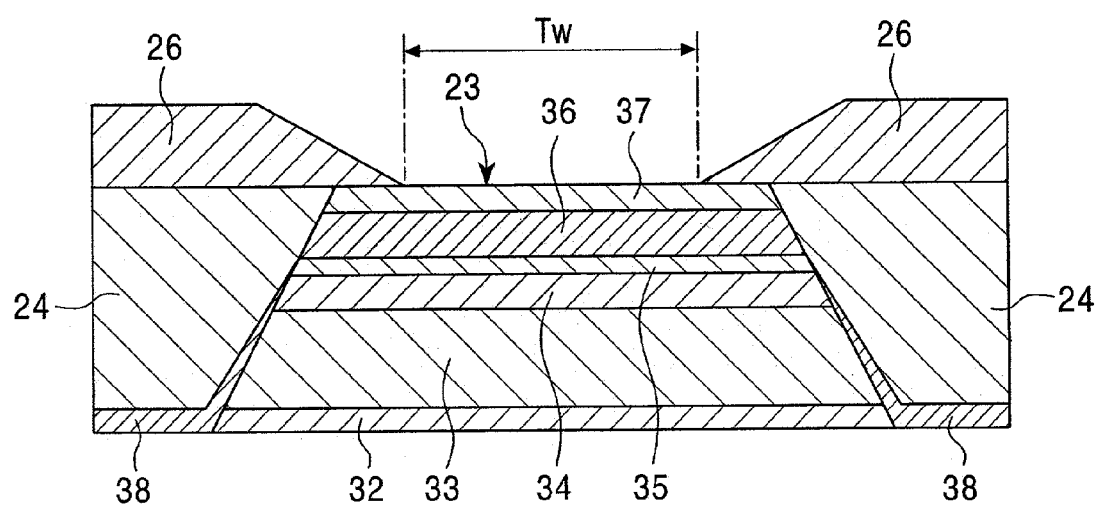
FIG. 8 is an enlarged partial sectional view showing the structure of a magnetic sensing element according to still another embodiment of the present invention, as viewed from a surface facing a recording medium.

In the embodiment shown in FIG. 8, the magnetoresistive film 23 comprises an underlying layer 32, an antiferromagnetic layer 33, a pinned magnetic layer 34, a nonmagnetic intermediate layer 35, a free magnetic layer 36 and a protecting layer 37, which are laminated in turn from the bottom.

Each of the underlying layer 32 and the protecting layer 37 is made of, for example, at least one of Ta, Hf, Nb, Zr, Ti, Mo, W, Ni, and Fe.

Preferably, the antiferromagnetic layer 33 is made of, for example, an antiferromagnetic material containing element X (wherein X is at least one of Pt, Pd, Ir, Rh, Ru, and Os) and Mn, or an antiferromagnetic material containing element X and element X' (X' is at least one of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and the rare earth elements) and Mn.

The pinned magnetic layer 34 and the free magnetic layer 36 are made of a magnetic material such as a NiFe alloy, a CoFeNi alloy, a CoFe alloy, Co, or the like. The pinned magnetic layer 34 and the free magnetic layer 36 may comprise a single layer film or a multilayer film. The nonmagnetic intermediate layer 35 is made of a nonmagnetic conductive material such as Cu or the like.

As shown in FIG. 8, bias underlying layers 38 are further formed below the hard bias layers 24 formed on both sides of the magnetoresistive film 23 in the track width direction.

The bias underlying layers 38 are provided for improving the characteristics (coercive force Hc, remanence ratio S) of the hard bias layers 24.

As shown in FIG. 8, the electrode layers 26 are formed with a space therebetween on the magnetoresistive film 23 so that the track width Tw is regulated by the space between the electrode layers 26.

Figure 9:
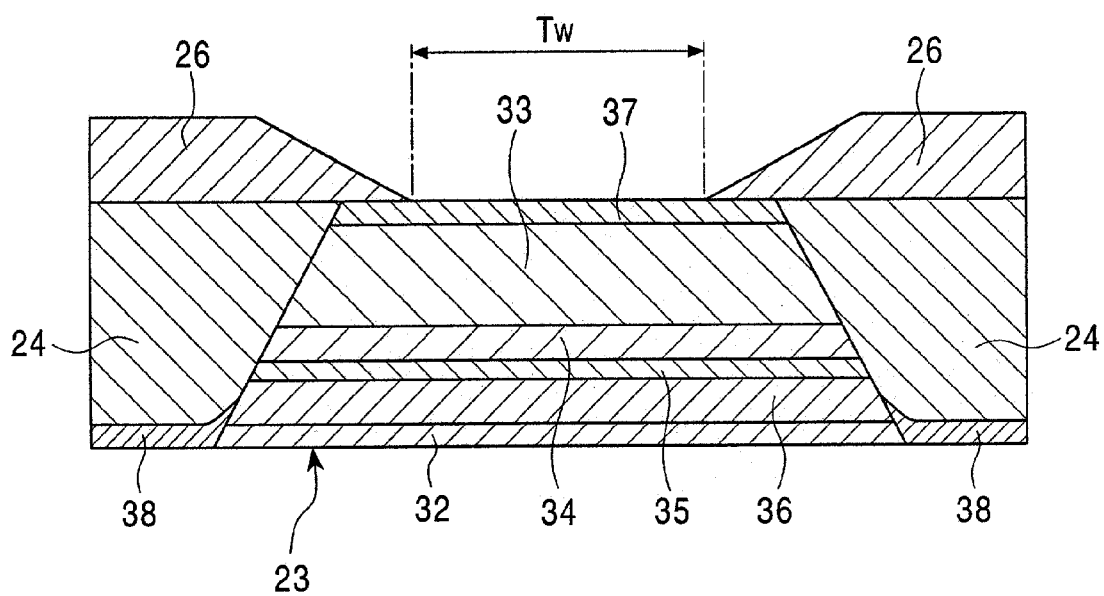
FIG. 9 is an enlarged partial sectional view showing the structure of a magnetic sensing element according to a further embodiment of the present invention, as viewed from a surface facing a recording medium.

FIG. 9 shows the magnetoresistive film 23 having a laminated structure different from that shown in FIG. 8. Namely, FIG. 9 shows the magnetoresistive film 23 comprising an underlying layer 33, a free magnetic layer 36, a nonmagnetic intermediate layer 35, a pinned magnetic layer 34, an antiferromagnetic layer 33 and a protecting layer 37, which are laminated in turn from the bottom. The material of each of the layers is the same as FIG. 8.

Figure 10:
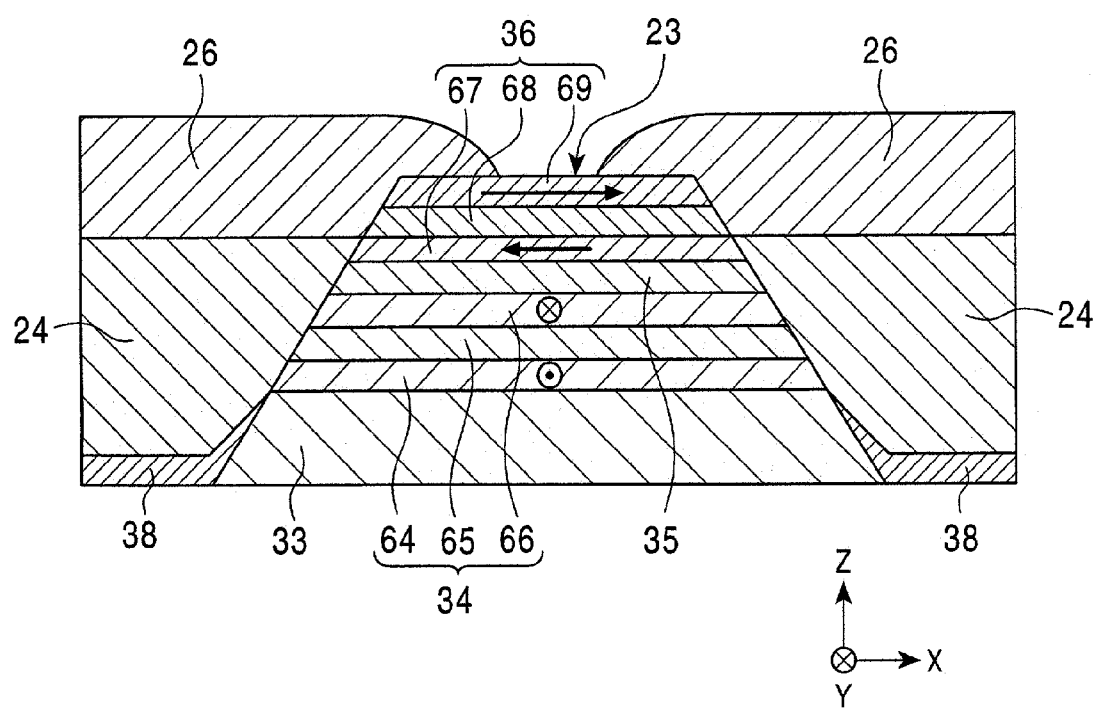
FIG. 10 is an enlarged partial sectional view showing the structure of a magnetic sensing element according to a still further embodiment of the present invention, as viewed from a surface facing a recording medium.

The magnetoresistive film 23 of the magnetic sensing element shown in FIG. 10 comprises an antiferromagnetic layer 33, a pinned magnetic layer 34, a nonmagnetic conductive layer 35, and a free magnetic layer 36, which are laminated in turn from the bottom.

The embodiment shown in FIG. 10 is different from that shown in FIG. 8 in the structure of each of the pinned magnetic layer 34 and the free magnetic layer 36.

In FIG. 10, the pinned magnetic layer 34 has a laminated ferrimagnetic structure having the film structure comprising a magnetic layer 64, a nonmagnetic intermediate layer 65 and a magnetic layer 66. The magnetic layers 64 and 66 are made of a magnetic material such as a NiFe alloy, a CoFeNi alloy, a CoFe alloy, Co, or the like. The nonmagnetic intermediate layer 65 is made of at least one nonmagnetic material of Ru, Rh, Ir, Cr, Re, and Cu.

In the laminated ferrimagnetic structure, magnetic moments (saturation magnetization Ms×thickness t) per unit area of the magnetic layers 64 and 66 are controlled to be different from each other. The magnetic layer 64 is magnetized, for example, in the direction opposite to the Y direction shown in the drawing, and pinned by an exchange coupling magnetic field produced between the magnetic layer 64 and the antiferromagnetic layer 33. On the other hand, magnetization of the other magnetic layer 66 is pinned, by an exchange coupling magnetic field due to RKKY interaction between the magnetic layers 64 and 66, in antiparallel with magnetization of the magnetic layer 64 in the Y direction shown in the drawing.

In this embodiment, the free magnetic layer 36 also has a laminated ferrimagnetic structure like the pinned magnetic layer 34. The free magnetic layer 36 has a three-layer structure comprising, for example, a magnetic layer 67, a nonmagnetic intermediate layer 68 and a magnetic layer 69.

The magnetic layers 67 and 69 have different magnetic moments per unit area. The magnetic layers 67 and 69 are magnetized, in antiparallel in the track width direction, by the influence of a longitudinal magnetic field from the hard bias layers 24 and an exchange coupling magnetic field due to RKKY interaction produced between the magnetic layers 67 and 69.

Although, in this embodiment, both the pinned magnetic layer 34 and the free magnetic layer have the laminated ferrimagnetic structure, either of both layers may be formed in the laminated ferrimagnetic structure.

Figure 11:
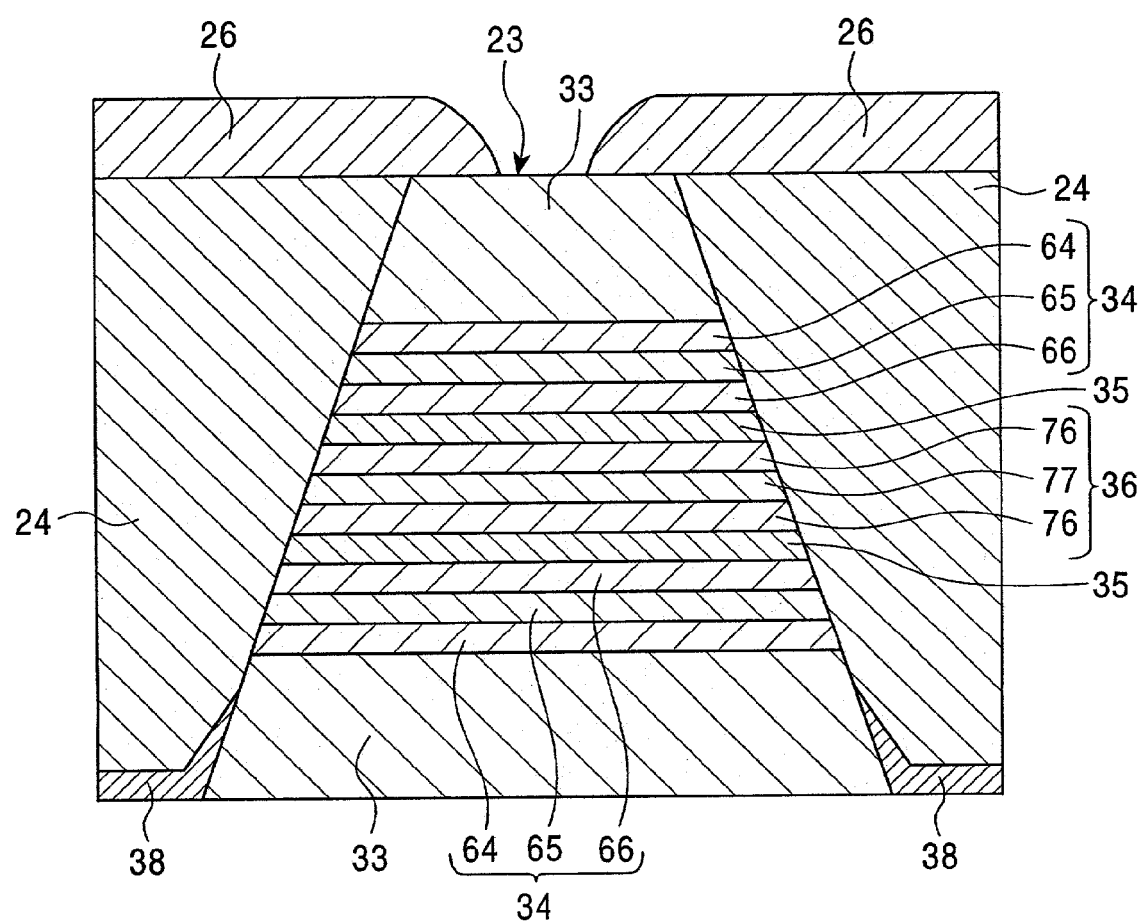
FIG. 11 is an enlarged partial sectional view showing the structure of a magnetic sensing element according to a further embodiment of the present invention, as viewed from a surface facing a recording medium.

FIG. 11 shows a so-called dual spin valve structure.

The embodiment shown in FIG. 11 has a structure in which a nonmagnetic intermediate layer 35, a pinned magnetic layer 34 and an antiferromagnetic layer 33 are formed each of above and below a free magnetic layer 36.

In this embodiment, the free magnetic layer 36 has a three-layer structure comprising magnetic layers 76 each made of a CoFe alloy, Co or the like, and a magnetic layer 77 made of a NiFe alloy or the like. The magnetic layer 76 serves as an anti-diffusion layer for preventing diffusion of metal elements between a nonmagnetic intermediate layer 35 and the magnetic layer 77, thereby improving a change ($\Delta R$) in resistance and the rate of change in resistance ($\Delta R/R$). The structure comprising the anti-diffusion layer can also be applied to each of the embodiments shown in FIGS. 8 to 10. Also, the free magnetic layer 36 may be formed in the same laminated ferrimagnetic structure as shown in FIG. 10.

Although, in the embodiment shown in FIG. 11, the pinned magnetic layer 34 has a laminated ferrimagnetic layer, the pinned magnetic layer 34 may be formed in a single layer structure or a multilayer structure comprising the same magnetic material as FIGS. 8 and 9.

Figure 12:
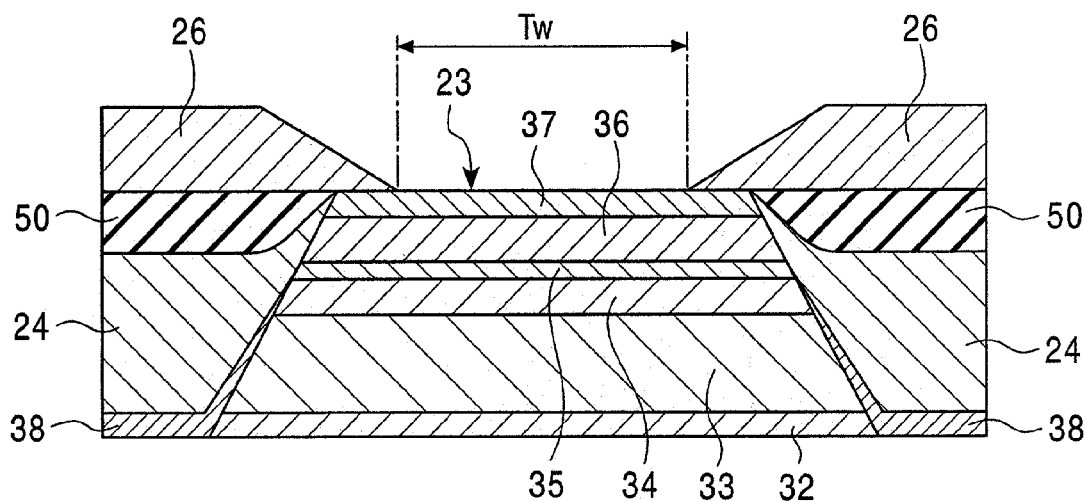
FIG. 12 is an enlarged partial sectional view showing the structure of a magnetic sensing element according to a further embodiment of the present invention, as viewed from a surface facing a recording medium.

Besides the structures of the magnetic sensing elements shown in FIGS. 8 to 11, the magnetic sensing element may be an AMR magnetoresistive element using anisotropic magnetoresistance and comprising the three layers including a magnetoresistive layer (MR layer) made of a NiFe alloy or the like, a shunt layer made of Ta or the like, and a SAL layer made of a NiFe alloy of the like, In FIG. 12, planarizing layers 50 are provided between the electrode layers 26 and the hard bias layers 24. In the magnetic sensing. element shown in FIG. 12, the planarizing layers 50 are formed on the hard bias layers 24 to planarize the surface of the magnetoresistive film 23 and the surfaces of the planarizing layers 50. By forming the planarizing layers 50, a planarized surface can easily formed around the magnetoresistive film 23. Therefore, the electrode layers 26 can be formed in a predetermined shape on the planarizing layers 50 and the magnetoresistive film 23.

The planarizing layers 50 are preferably made of a material having higher resistivity than the electrode layers 26. This can suppress shunting of the sensing current to the planarizing layers 50. The planarizing layers 50 also have the function as anti-diffusion layers between the electrode layers 26 and the hard bias layers 24. For the planarizing layers 50, materials such as Ta, Cr, WTi, TiN, and the like can be used.

Figure 13:
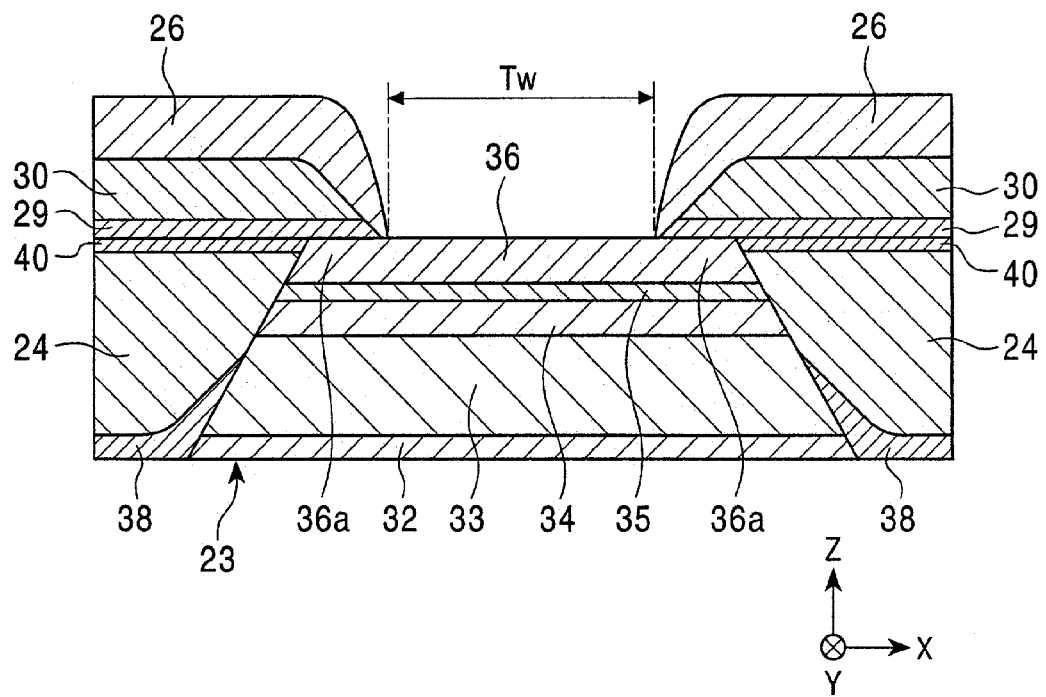
FIG. 13 is an enlarged partial sectional view showing the structure of a magnetic sensing element according to a further embodiment of the present invention, as viewed from a surface facing a recording medium.
Figure 14A:
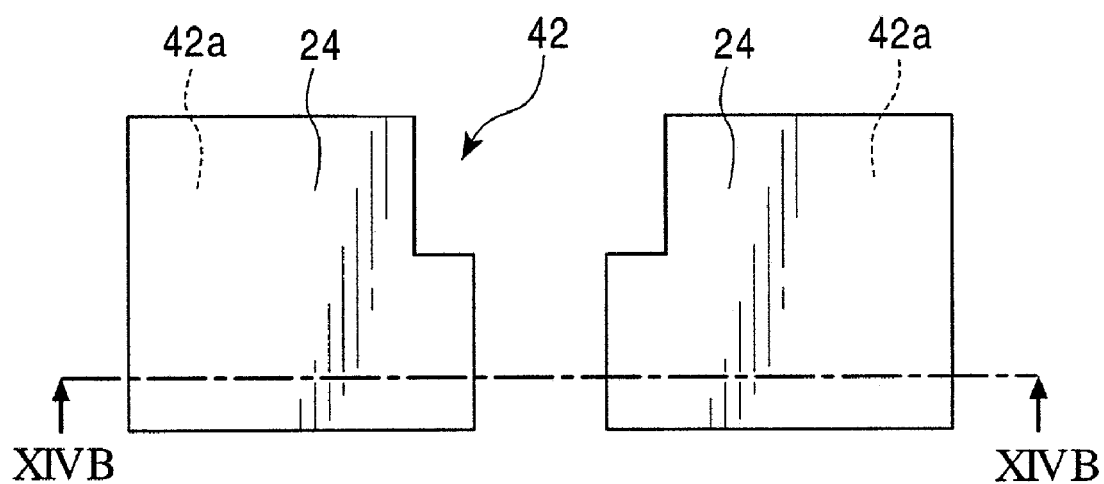
FIGS. 14A and 14B are drawings showing a step of a method of manufacturing the magnetic sensing element shown in FIG. 13.
Figure 14B:
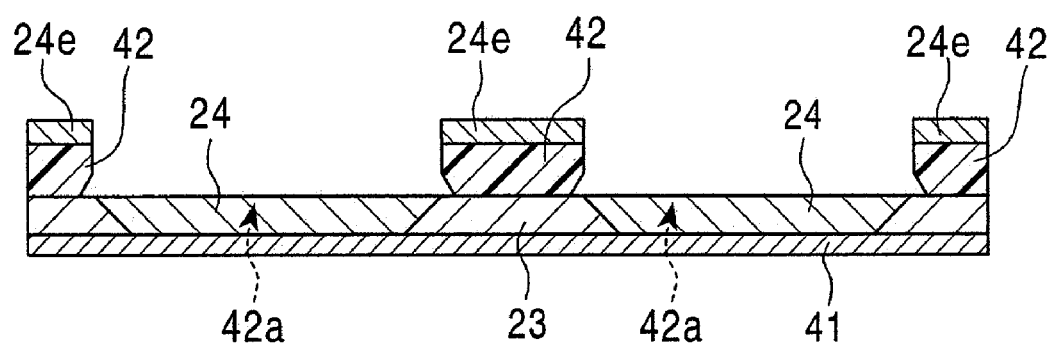

FIG. 13 is a partial sectional view showing a preferred structure of a magnetic sensing element in which like in FIGS. 5 and 7, ferromagnetic layers 29 and antiferromagnetic layers 30 are interposed between the hard bias layers 24 and the electrode layers 26, as viewed from the surface facing the recording medium.

In the laminated structure of the magnetoresistive film 23 of the magnetic sensing element shown in FIG. 13, an underlying layer 32, an antiferromagnetic layer 33, a pinned magnetic layer 35, and a free magnetic layer 36 are formed in turn from the bottom, and the ferromagnetic layers 29 are formed with a predetermined space therebetween directly on the free magnetic layer 36. Consequently, ferromagnetic coupling occurs between the free magnetic layer 36 and the ferromagnetic layers 29, and thus magnetization at both side ends 36a of the free magnetic layer 36 can be appropriately pinned in the X direction shown in the drawing.

A protecting layer 37 may be formed on the exposed portion of the free magnetic layer 36 between the ferromagnetic layers 29.

Each of the free magnetic layer 36 and the pinned magnetic layer 34 my be formed in the laminated ferrimagnetic structure as shown in FIG. 10.

In the structure in which the ferromagnetic layers 29 and the antiferromagnetic layers 30 are formed to overlap the upper surface of the magnetoresistive film 23, the laminated structure must be formed so that the free magnetic layer 36 becomes the uppermost layer of the magnetoresistive film 23.

In the embodiment shown in FIG. 13, nonmagnetic intermediate layers 40 are formed between the hard bias layers 24 and the ferromagnetic layers 29 in order to improve the characteristics of the ferromagnetic layers 29. Specifically, an exchange anisotropic magnetic field produced between the ferromagnetic layers 29 and the antiferromagnetic layers 30, and the blocking temperature can be increased. The intermediate layers 40 are not necessarily formed.

The intermediate layers 40 are made of at least one element of Ta, Cr, W, Mo, V, Mn and Nb.

FIG. 14 to 20 are drawings each showing a step of the method of manufacturing a magnetic sensing element of the present invention. FIGS. 14A to 20A are partial plan views, and FIGS. 14B to 20B are partial sectional views taken along one-dot chain lines in FIGS. 14A to 20A, respectively, as viewed from the direction of arrows.

In the step shown in FIG. 14, the magnetoresistive film 23 having any one of the laminated structures shown in FIGS. 8 to 11 is deposited on a substrate 31, and then a lift-off resist layer 42 is formed on the magnetoresistive film 23. The resist layer 42 has bias patterns 42a (bias formation regions) 42a formed by an exposure phenomenon, for forming the hard bias layers 24. The portions of the magnetoresistive film 23, which are exposed in the bias patterns 42a, are removed by ion milling.

Next, the hard bias layers 24 are deposited in the bias patterns 42a by sputtering or ion beam sputtering. The layer 24e made of a bias material are also formed on the resist layer 42. Then, the resist layer 42 is removed.

Figure 15A:
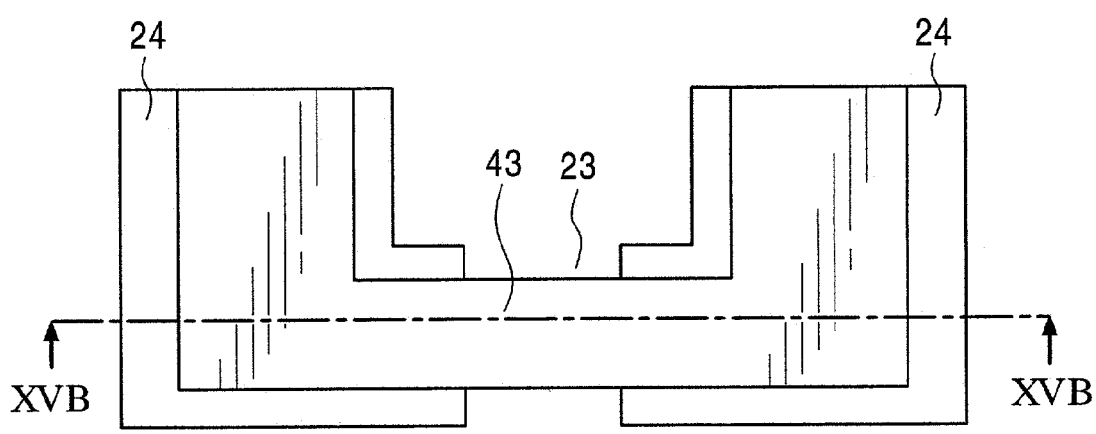
FIGS. 15A and 15B are drawings showing a step after the step shown in FIG. 14.
Figure 15B:
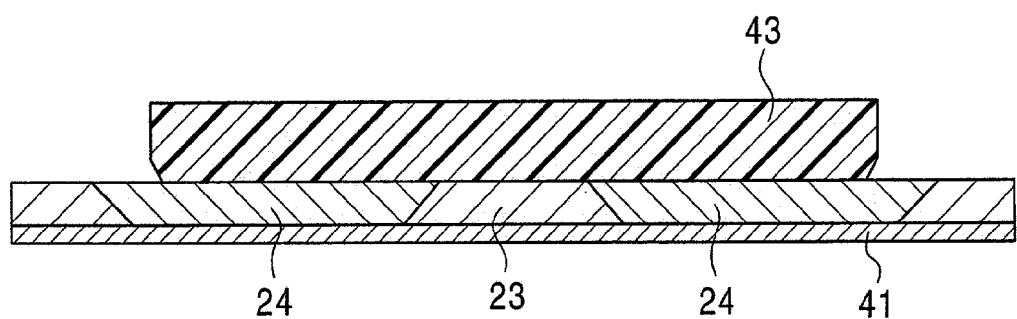

In the step shown in FIG. 15, a lift-off resist layer 43 is formed on the hard bias layers 24 and the magnetoresistive film 23 held between the hard bias layers 24 on the recording medium-facing surface side, for determining the rear end face in the height direction.

Figure 16A:
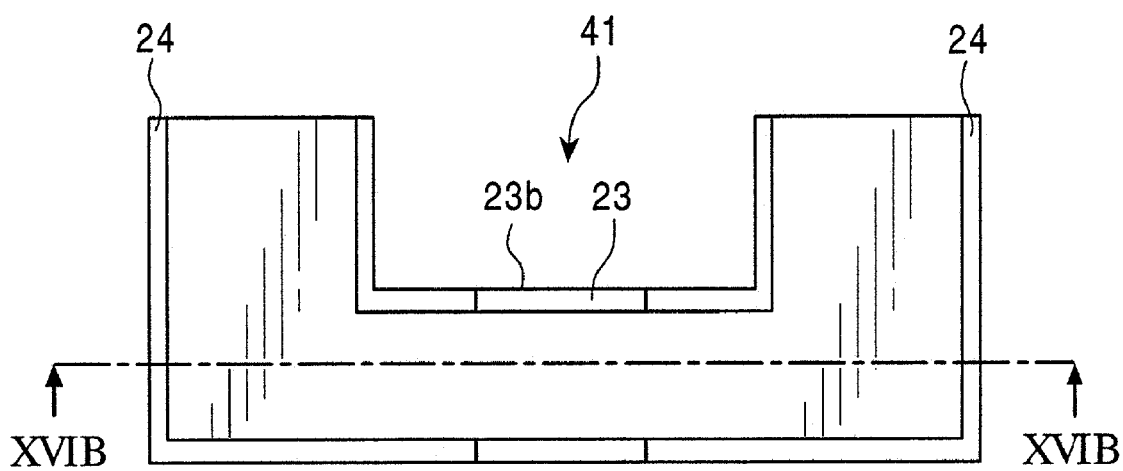
FIGS. 16A and 16B are drawings showing a step after the step shown in FIG. 15.
Figure 16B:
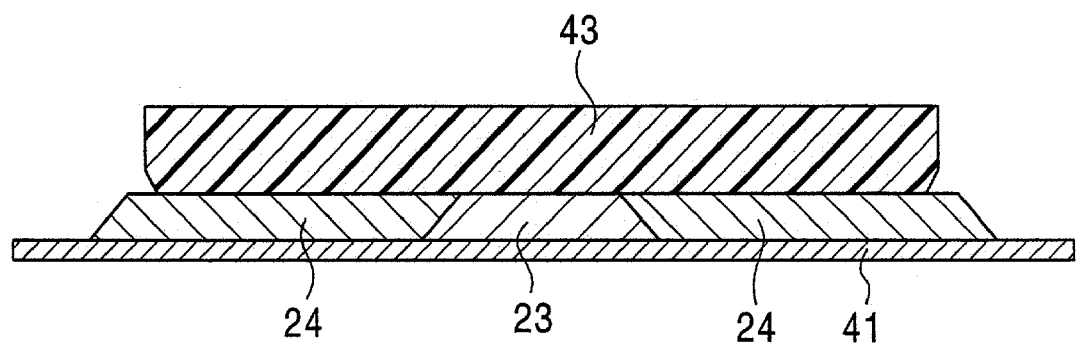

In the step shown in FIG. 16, the portions of the magnetoresistive film 23 and the hard bias layers 24, which are not covered with the resist layer 43, are removed by ion milling or the like. As a result, the rear end face 23b of the magnetoresistive film 23 in the height direction is determined.

Figure 17A:
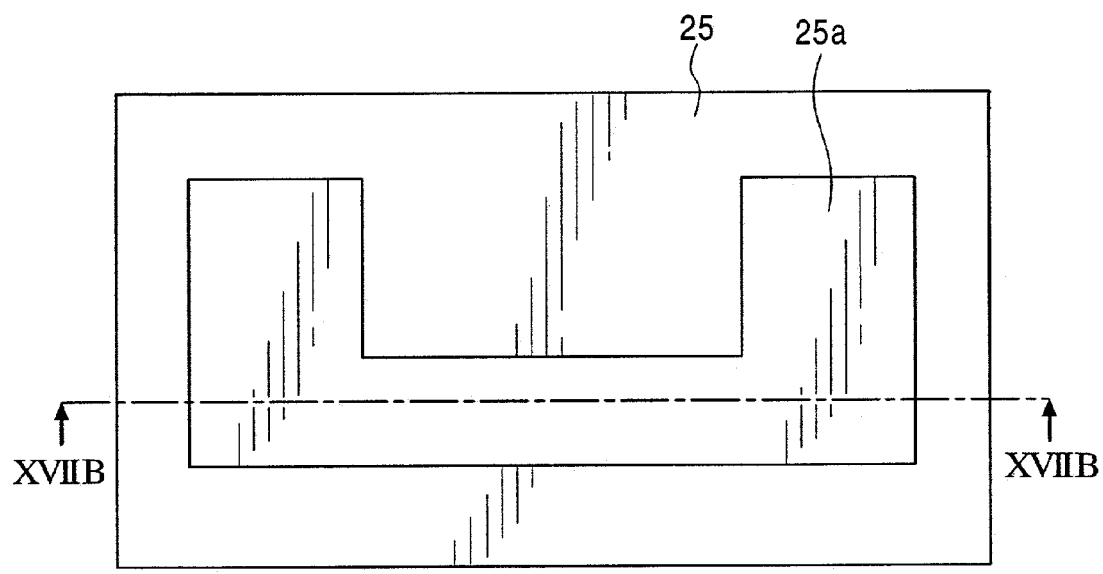
FIGS. 17A and 17B are drawings showing a step after the step shown in FIG. 16.

In the step shown in FIG. 17, the insulating layers 25 of $Al_2O_3$ are deposited, by sputtering or ion beam sputtering using the resist layer 43 shown in FIG. 16, on the portions of the substrate 41, which are exposed by partially removing the magnetoresistive film 23 and the hard bias layers 24 in the previous step.

Figure 17B:
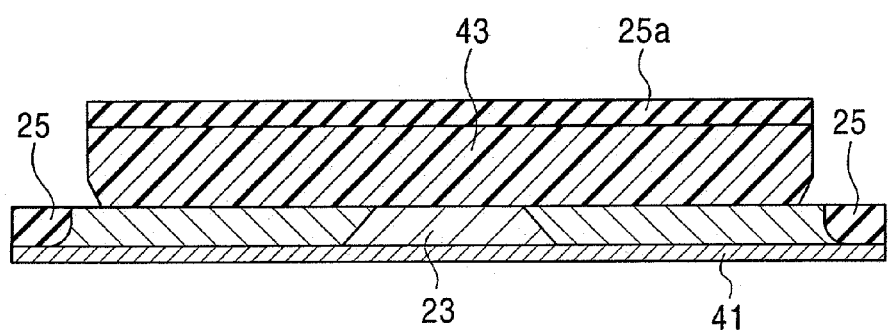

As shown in FIG. 17B, in depositing the insulating layers 25 by sputtering, an insulating material layer 25a is also deposited on the resist layer 43. Then, the resist layer 43 is removed.

In a top view of the magnetic sensing element after the resist layer 43 is removed, the magnetoresistive film 23, the hard bias layers 24 formed on both sides of the magnetoresistive film 23 in the track width direction, and the insulating layers 25 formed to cover the periphery of the magnetoresistive film 23 appear.

Figure 18A:
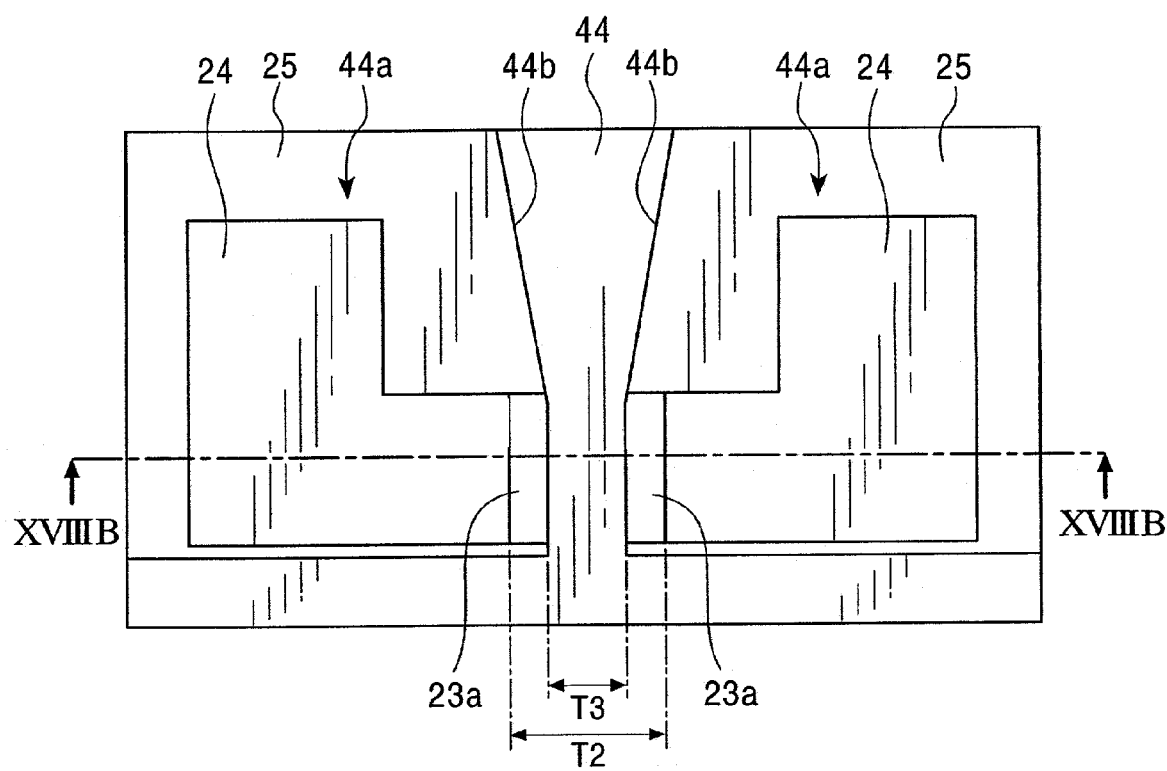
FIGS. 18A and 18B are drawings showing a step after the step shown in FIG. 17.
Figure 18B:
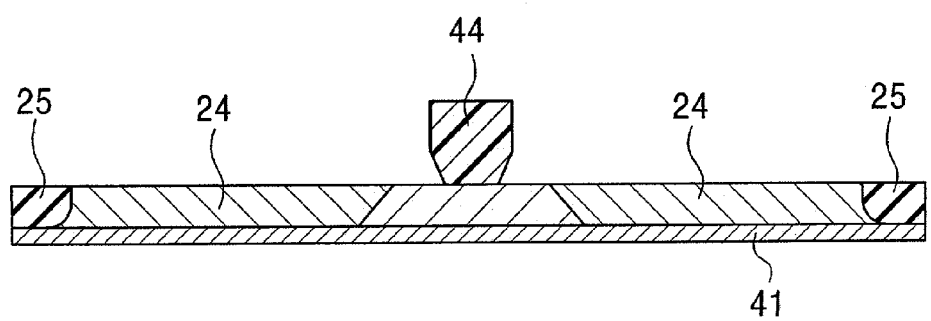

Next, in the step shown in FIG. 18, the magnetoresistive film 23, the hard bias layers 24 and the insulating layers 25 are coated with a resist layer 44, and then electrode patterns 44a are formed in the resist layer 44.

In forming the electrode patterns 44a, care must be taken to the following points. First, the width dimension T3 of the resist layer 44 in the track width direction, which remains on the magnetoresistive film 23, is smaller than the width dimension T2 of the magnetoresistive film in the track width direction to expose both ends 23a of the magnetoresistive film 23 from both sides of the resist film 44 in the track width direction. Second, in the region behind the magnetoresistive film 23 in the height direction, the inner side end faces 44b of the electrode patterns 44a are formed on the insulating layers 25 below which the hard bias layers 24 are not formed.

Figure 19A:
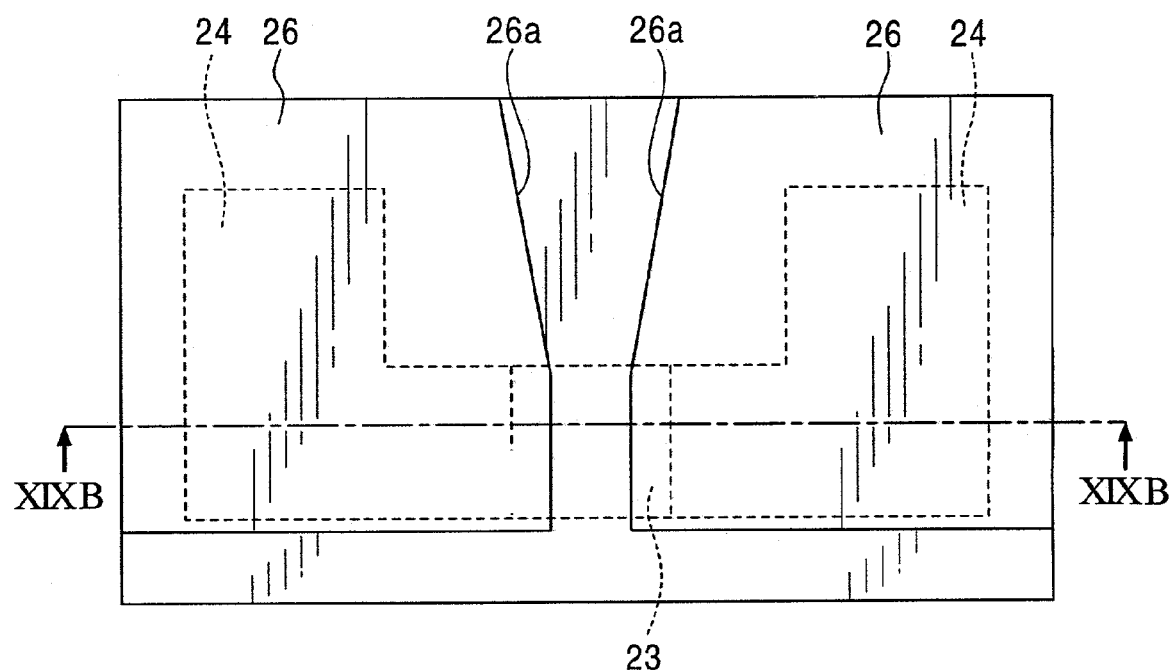
FIGS. 19A and 19B are drawings showing a step after the step shown in FIG. 18.
Figure 19B:
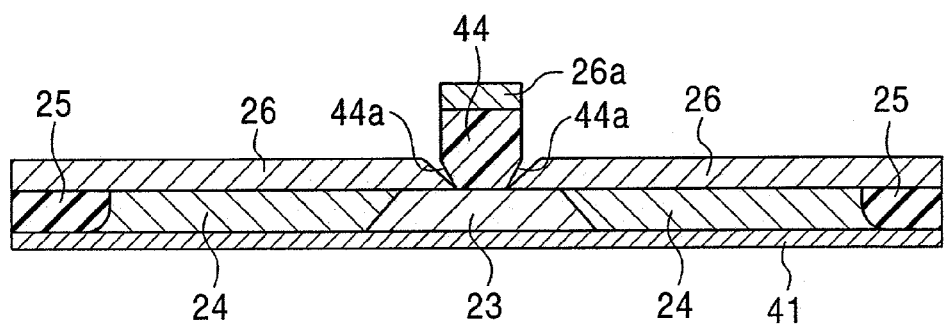
Figure 21:
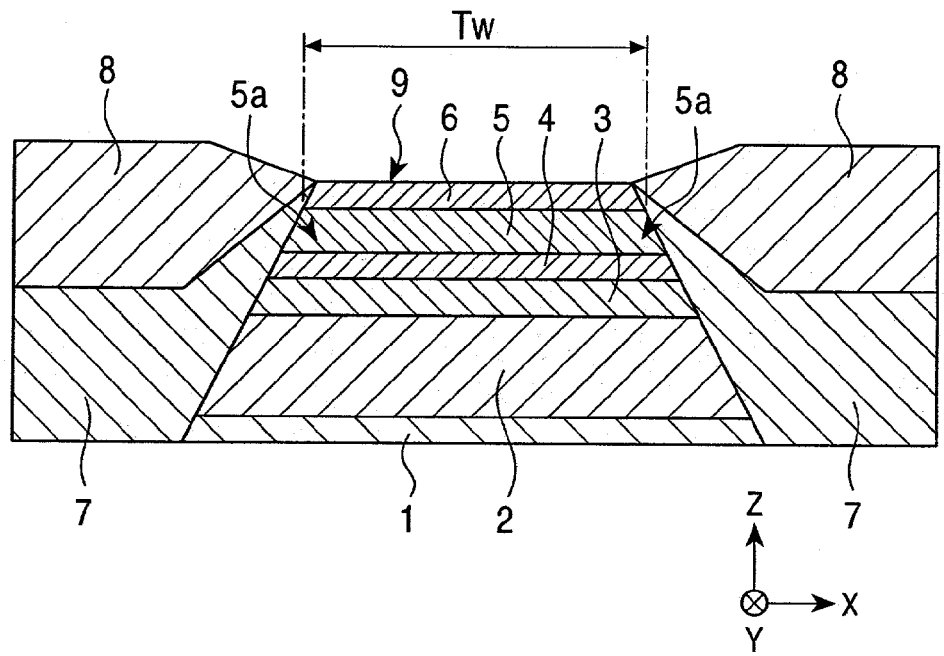
FIG. 21 is a partial sectional view showing a conventional magnetic sensing element, as viewed from a surface facing a recording medium.
Figure 22:
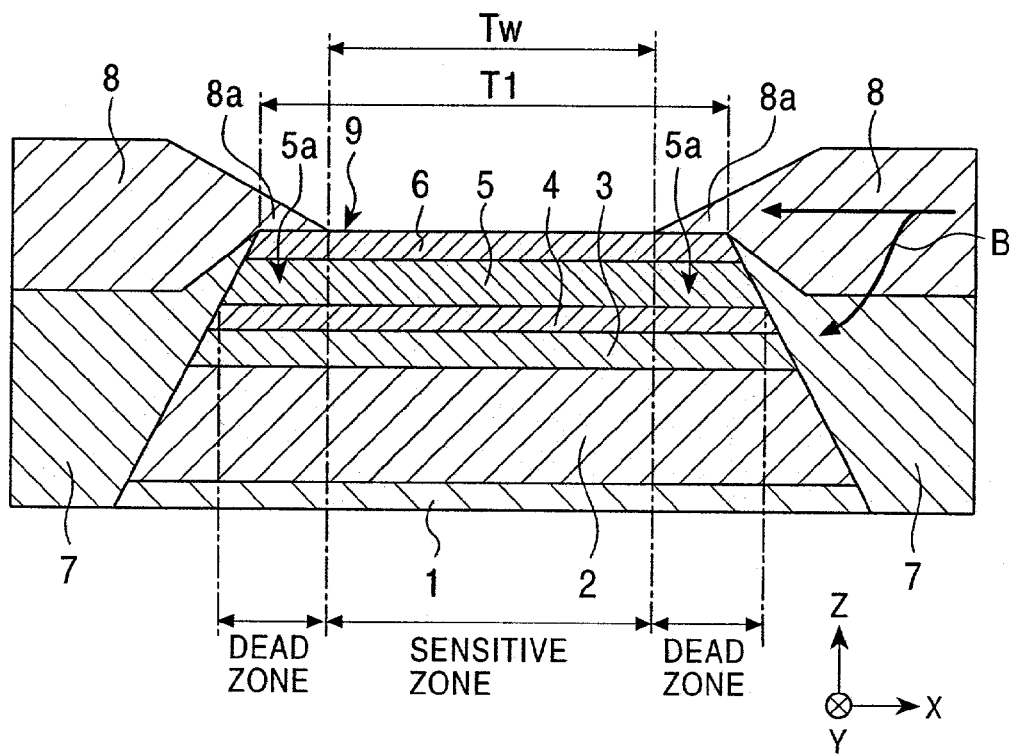
FIG. 22 is a partial sectional view showing another conventional magnetic sensing element, as viewed from a surface facing a recording medium.
Figure 24A:
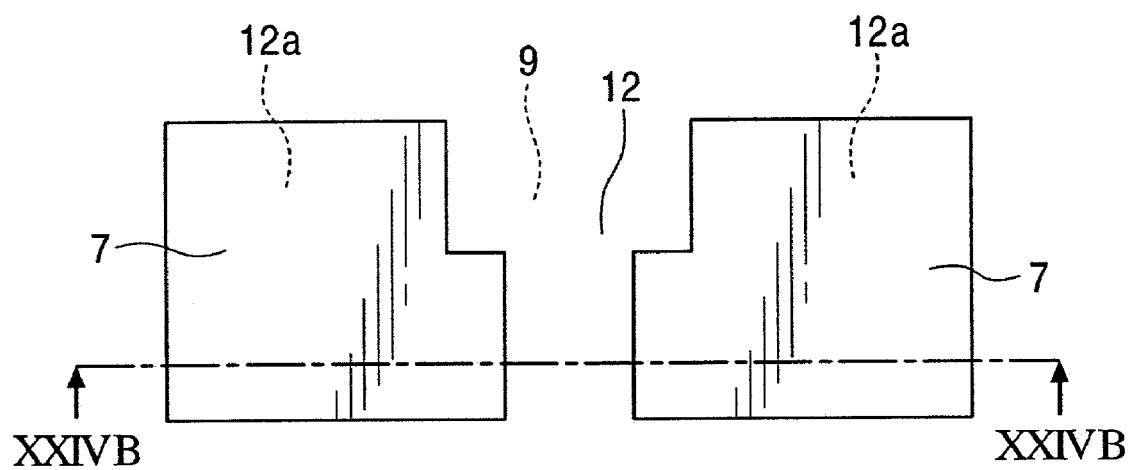
FIGS. 24A and 24B are drawings showing a step of a method of manufacturing the magnetic sensing element shown in FIGS. 22 and 23.
Figure 24B:
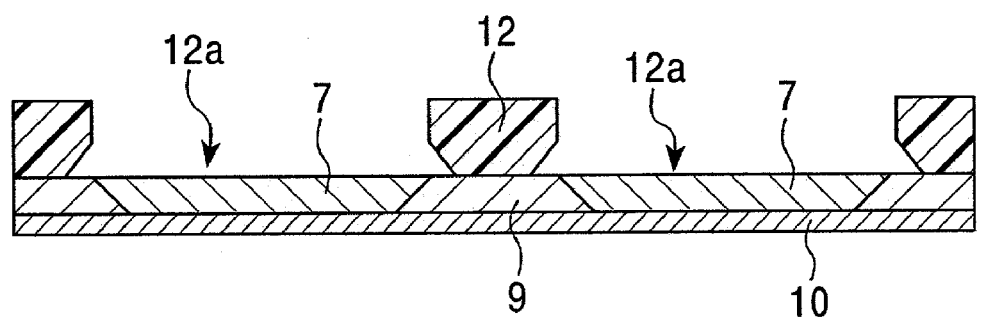
Figure 25A:
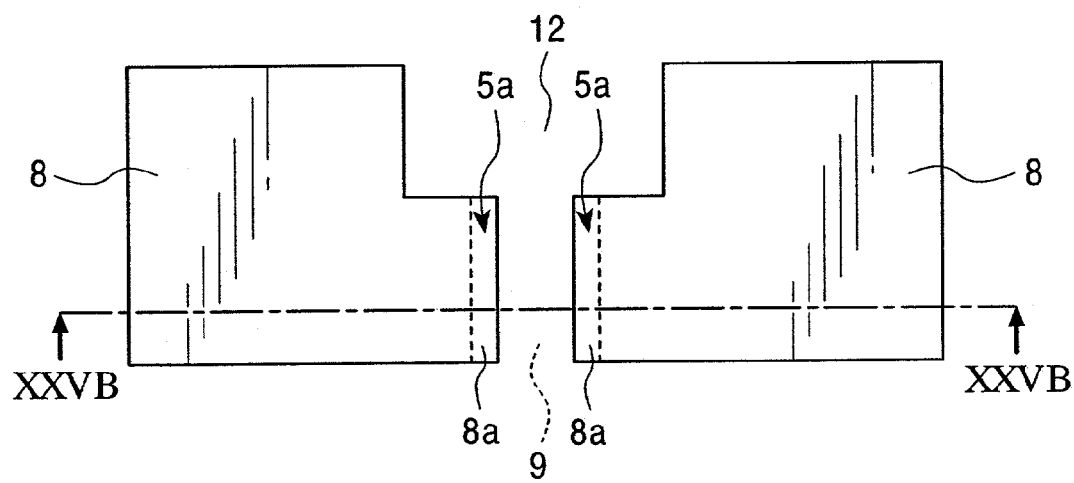
FIGS. 25A and 25B are drawings showing a step after the step shown in FIG. 24.
Figure 25B:
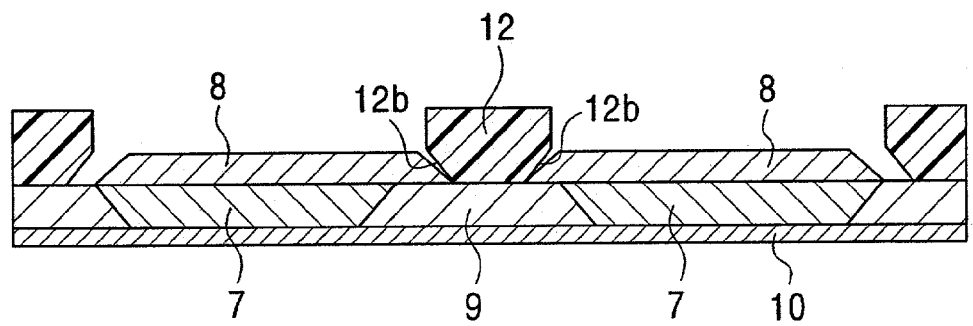
Figure 26A:
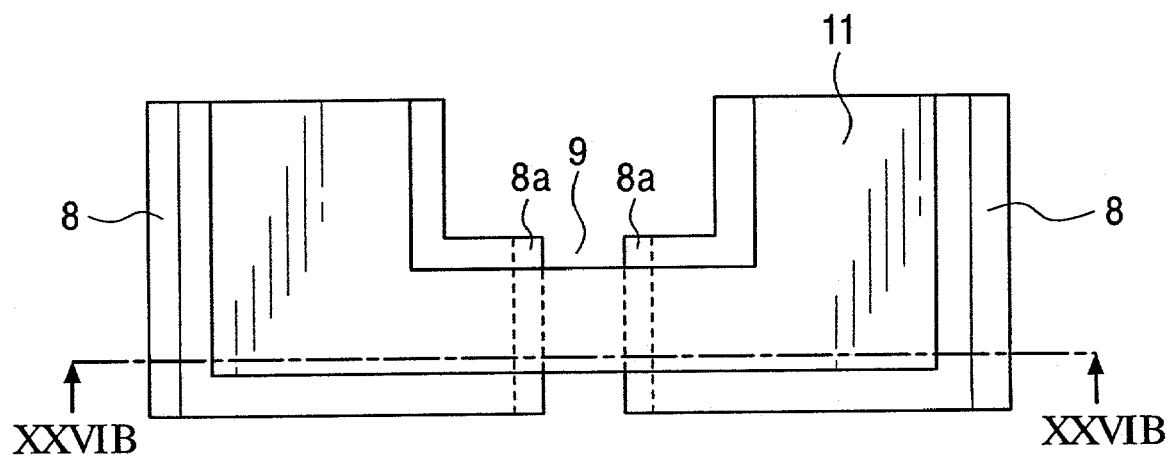
FIGS. 26A and 26B are drawings showing a step after the step shown in FIG. 25.
Figure 26B:
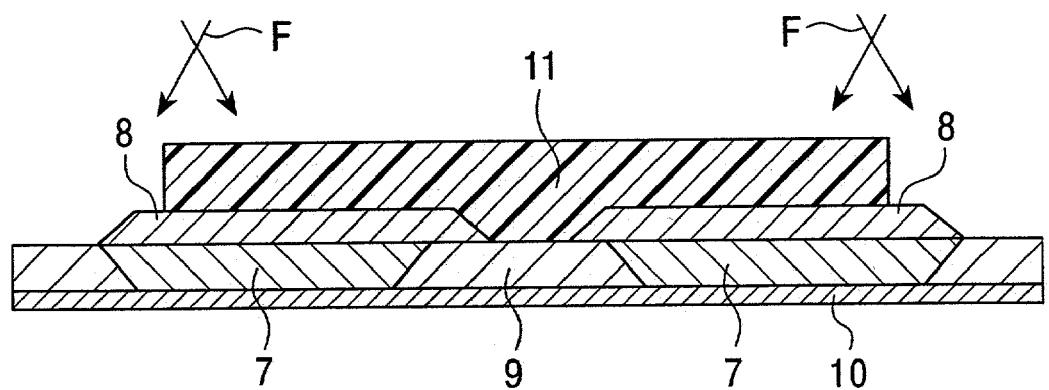

In the step shown in FIG. 19, the electrode layers 26 are deposited in the electrode patterns 44a formed in the resist layer 44. In this step, a layer 26a of the electrode material is also deposited on the resist layer 44 by ion beam sputtering.

As described above, the resist layer 44 formed on the magnetoresistive film 23 is narrower than the magnetoresistive film 23 to expose both ends 23a of the magnetoresistive film 23 from both sides of the resist layer 44. Therefore, in the step shown in FIG. 19, the electrode layers 26 are formed to overlap both ends 23a of the magnetoresistive film 23.

During sputtering, the sputtering direction is inclined from the direction perpendicular to the substrate 41 so that the electrode layers 26 are formed in the notches 44a formed at the lower surface of the resist layer 44. Thereby, the electrode layers 26 can be formed below the notches 44a, and the electrode layers can thus be appropriately overlapped with the magnetoresistive film 23.

Since the inner side end faces 44b of the electrode patterns 44a are formed on the insulating layers 25 below which the hard bias layers 24 are not formed, so as to extend rearward from the magnetoresistive film 23 in the height direction, the inner side end faces 26a of the electrode layers 26 formed in the electrode patterns 44a are formed on the insulating layers 25 below which the hard bias layers 24 are not formed.

The electrode layers 26 can also be formed by IBD or the like other than sputtering. Then, the resist layer 44 is removed.

In the next step shown in FIG. 20, the magnetic sensing element is processed from the surface facing the recording medium to line D—D, for determining the height. In this process, the DC resistance value of the magnetoresistive film 23 is set within a predetermined range. In the processing for determining the height, the magnetoresistive film 23, the hard bias layers 24 and the electrode layers 26 are exposed. In FIG. 20, a lower drawing shows a partial section of the magnetic sensing element after the processing for determining the height.

In the above-described method of manufacturing a magnetic sensing element of the present invention, the hard bias layers 24 are formed in the step shown in FIG. 14 using the resist layer 42, and then the resist layer 44 is formed for forming the electrode layer 26 in the step shown in FIG. 18 after the resist layer 42 is removed.

The hard bias layers 24 and the electrode layers 26 are conventionally formed by using the same resist layer. However, in the present invention, the hard bias layers 24 and the electrode layers 26 are formed by using different resist layers to increase the degree of freedom of the shape of the electrode layers 26.

In the present invention, the electrode layers 26 are partially overlapped with the magnetoresistive film 23, and in a region behind the magnetoresistive film 23 in the height direction, the inner side end faces 26a of the electrode layer 26 can be formed on the insulating layers 25 below which the hard bias layers 24 are not formed, thereby permitting the easy formation of the magnetic sensing element capable of decreasing variations in the track width and appropriately complying with track narrowing.

In order to form the electrode layers 26 and the hard bias layers 24 in the shapes shown in FIGS. 3 and 4, the bias patterns 42a of the resist layer 42 in the step shown in FIG. 14, and the electrode patterns 44a of the resist layer 44 in the step shown in FIG. 18 may be formed, by an exposure phenomenon, in the shapes of the electrode layers 26 and the hard bias layers 24 shown in FIGS. 3 and 4.

In order to interpose the ferromagnetic layers 29 and the antiferromagnetic layers 30 between the hard bias layers 24 and the electrode layers 26, as shown in FIG. 5, a resist layer for forming the ferromagnetic layers 29 and the antiferromagnetic layers 30 is formed, and then ferromagnetic layers 29 and the antiferromagnetic layers 30 are formed between the step shown in FIG. 17 and the step shown in FIG. 18. Then, the step shown in FIG. 18 is performed.

In order to form the electrode layers having the two-layer structure shown in FIG. 12, the hard bias layers 24 and the planarizing layer 50 are deposited by sputtering or ion beam sputtering using the same resist layer 42 in the step shown in FIG. 14. The subsequent steps are the same as described above.

The magnetic sensing element of the present invention can be used not only for a thin film magnetic head mounted on a hard disk device, but also for a magnetic head for tapes, a magnetic sensor, and the like.

As described in detail above, in the present invention, electrode layers are formed to overlap a magnetoresistive film, and thus the magnetoresistive film can be formed with a longer width dimension than the track width Tw. Therefore, even when track narrowing is demanded, the width dimension of the magnetoresistive film can be appropriately controlled to maintain the sensitive region having a predetermined width.

Furthermore, in the present invention, the inner side end faces of the electrode layers are formed in a region below which the bias layers are not formed, behind the magnetoresistive film in the height direction.

Therefore, the bias layers are not formed below the inner side end faces of the electrode layers, and thus the sensing current flowing from the electrode layers can be appropriately inhibited from shunting to the bias layers, thereby improving the current density at the inner side ends of the electrode layers which are overlapped with the magnetoresistive film.

Therefore, in the present invention, reproduced output can be improved, and shunting of the sensing current from the bias layers to the dead zones can be suppressed to permit the sensing current to appropriately flow to the sensitive zone of the magnetoresistive film from the inner side ends of the electrode layers. It is thus possible to manufacture a magnetic sensing element capable of preventing the problem of widening the track width, complying with track narrowing, and suppressing variations in the track width Tw.

What is claimed is:

1. A magnetic sensing element comprising a magnetoresistive film having a portion exhibiting magnetoresistance, and bias layers and electrode layers provided on both sides of the magnetoresistive film in a track width direction;
   wherein the electrode layers are formed to extend from the rear in a height direction to the magnetoresistive film;
   the bias layers are disposed on both sides of the magnetoresistive film in the track width direction,
   the electrode layers have a predetermined space therebetween in the track width direction over the magnetoresistive film,
   the electrode layers are formed over the bias layers,
   the bias layers are not disposed below inner side end faces of the electrode layers which are formed behind the magnetoresistive film in the height direction and a distance between the inner side end faces of the electrode layers increases towards the rear in the height direction;
   peripheries of the magnetoresistive film and the bias layers, except a surface facing a recording medium, are filled with an insulating layer so that the inner side end faces of the electrode layers are formed on the insulating layer, and
   an upper surface of the magnetoresistive film is coplanar with upper surfaces of the bias layers and the insulating layer.

2. A magnetic sensing element according to claim 1, wherein the magnetoresistive film comprises an antiferromagnetic layer, a pinned magnetic layer, a nonmagnetic intermediate layer, and a free magnetic layer.

3. A magnetic sensing element according to claim 1, wherein a ferromagnetic layer and an antiferromagnetic layer overlapping both side ends of the magnetoresistive film are formed between the bias layers and the electrode layers.

4. A magnetic sensing element according to claim 3, wherein inner ends of the electrode layers are positioned nearer to a center of the magnetoresistive film in the track width direction than the ferromagnetic and the antiferromagnetic layer which overlap both side ends of the magnetoresistive film, so that the inner ends are formed directly on the magnetoresistive film.

5. A magnetic sensing element according to claim 3, wherein a nonmagnetic intermediate layer is formed between the bias layers and the ferromagnetic layer.

6. A magnetic sensing element according to claim 5, wherein the nonmagnetic intermediate layer is made of a material containing at least one of Ta, Cr, Mo, V, Mn and Nb.

7. A magnetic sensing element according to claim 1, wherein a planarizing layer is interposed between the electrode layers and the bias layers.

8. A magnetic sensing element according to claim 7, wherein the planarizing layer is made of a material containing at least one of Ta, Cr, WTi and TiN.

9. A magnetic sensing element according to claim 1, wherein the electrode layers are formed to completely cover the bias layers.

10. A magnetic sensing element according to claim 1, wherein outer side end faces of the electrode layers are disposed directly above outer side end faces of the insulating layer.

11. A magnetic sensing element according to claim 1, wherein the bias layers are formed to have rear regions extending rearward from both side ends in a height direction.

* * * * *